US012751295B2

(12) United States Patent
Kano

(10) Patent No.: US 12,751,295 B2
(45) Date of Patent: Sep. 29, 2026

(54) SEMICONDUCTOR DEVICE

(71) Applicant: ROHM CO., LTD., Kyoto (JP)

(72) Inventor: Masaki Kano, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 396 days.

(21) Appl. No.: 18/491,315

(22) Filed: Oct. 20, 2023

(65) Prior Publication Data

US 2024/0047315 A1 Feb. 8, 2024

Related U.S. Application Data

(63) Continuation of application No. PCT/JP2022/020032, filed on May 12, 2022.

(30) Foreign Application Priority Data

Jun. 7, 2021 (JP) ................................. 2021-095201

(51) Int. Cl.

*H10W 70/40* (2026.01)
*H10W 74/10* (2026.01)
*H10W 72/00* (2026.01)
*H10W 72/60* (2026.01)
*H10W 90/00* (2026.01)

(52) U.S. Cl.

CPC ....... *H10W 70/424* (2026.01); *H10W 70/417* (2026.01); *H10W 74/111* (2026.01); (Continued)

(58) Field of Classification Search

CPC ............. H10W 70/424; H10W 70/417; H10W 74/111; H10W 72/646; H10W 72/886; (Continued)

(56) References Cited

U.S. PATENT DOCUMENTS

2008/0164590 A1* 7/2008 Xiaochun ......... H01L 23/49562 257/E23.044
2017/0207150 A1* 7/2017 Choi ................. H01L 23/49551
(Continued)

FOREIGN PATENT DOCUMENTS

DE 10 2020 109 703 10/2021
JP 2012-043956 3/2012
(Continued)

OTHER PUBLICATIONS

Office Action issued in corresponding German Patent Application No. 11 2022 002 587.5, Sep. 23, 2025, 8 pages w/translation.
(Continued)

*Primary Examiner* — Evan G Clinton
(74) *Attorney, Agent, or Firm* — HSML P.C.

(57) ABSTRACT

A semiconductor device including: a first lead; a semiconductor element provided with a first electrode; a conductive member electrically connecting the first lead and the first electrode to each other; a first conductive joining layer conductively joining the first lead and the conductive member to each other; and a second conductive joining layer conductively joining the first electrode and the conductive member to each other. The conductive member includes a first surface facing the first lead in a thickness direction of the semiconductor element, and a second surface facing the first lead in a first direction orthogonal to the thickness direction. The first lead includes a third surface facing the first surface, and a fourth surface facing the second surface. The first conductive joining layer is in contact with the first surface and the third surface.

16 Claims, 19 Drawing Sheets

(52) U.S. Cl.
CPC ........ *H10W 72/646* (2026.01); *H10W 72/886* (2026.01); *H10W 90/736* (2026.01); *H10W 90/767* (2026.01)

(58) Field of Classification Search
CPC ............. H10W 90/736; H10W 90/767; H10W 72/341–344; H01L 24/85; H01L 23/49548; H01L 23/49524
See application file for complete search history.

(56) References Cited

U.S. PATENT DOCUMENTS

| | | | | |
|---|---|---|---|---|
| 2019/0139873 | A1* | 5/2019 | Saito ................. | H01L 23/49562 |
| 2020/0176371 | A1 | 6/2020 | Ise et al. | |
| 2021/0305198 | A1* | 9/2021 | von Koblinski .... | H01L 21/7806 |

FOREIGN PATENT DOCUMENTS

| | | |
|---|---|---|
| JP | 2016-162773 | 9/2016 |
| JP | 2018-152468 | 9/2018 |
| JP | 2020-088319 | 6/2020 |
| JP | 2021-027146 | 2/2021 |

OTHER PUBLICATIONS

International Search Report issued in International Application No. PCT/JP2022/020032, Aug. 16, 2022, 2 pages.
Written Opinion issued in International Application No. PCT/JP2022/020032, Aug. 16, 2022, 3 pages.
Office Action issued in corresponding Japanese Patent Application No. 2023-527579, Jan. 6, 2026, 8 pages w/ translation.

* cited by examiner

SEMICONDUCTOR DEVICE

TECHNICAL FIELD

The present disclosure relates to a semiconductor device.

BACKGROUND ART

JP-A-2016-162773 discloses an example of a semiconductor device (power module) in which semiconductor elements are joined to a conductor layer. The semiconductor device includes a plurality of metal connection members that are joined to the conductor layer and the semiconductor elements. Thus, a large current can flow through the semiconductor elements.

However, in the semiconductor device disclosed in JP-A-2016-162773, at least one of the metal connection members may deviate relative to an electrode of the semiconductor element to which the metal connection member is to be joined. When the degree of deviation is comparatively large, the metal connection member may cover a gate electrode of the semiconductor element from above. In this case, when joining a wire to the gate electrode, the metal connection member impairs joining of the wire. Thus, there is a desire for a measure that can be taken to suppress deviation of a metal connection member relative to an electrode of a semiconductor element.

DETAILED DESCRIPTION OF EMBODIMENTS

Embodiments of the present disclosure will be described below with reference to the appended drawings.

Figure 1:
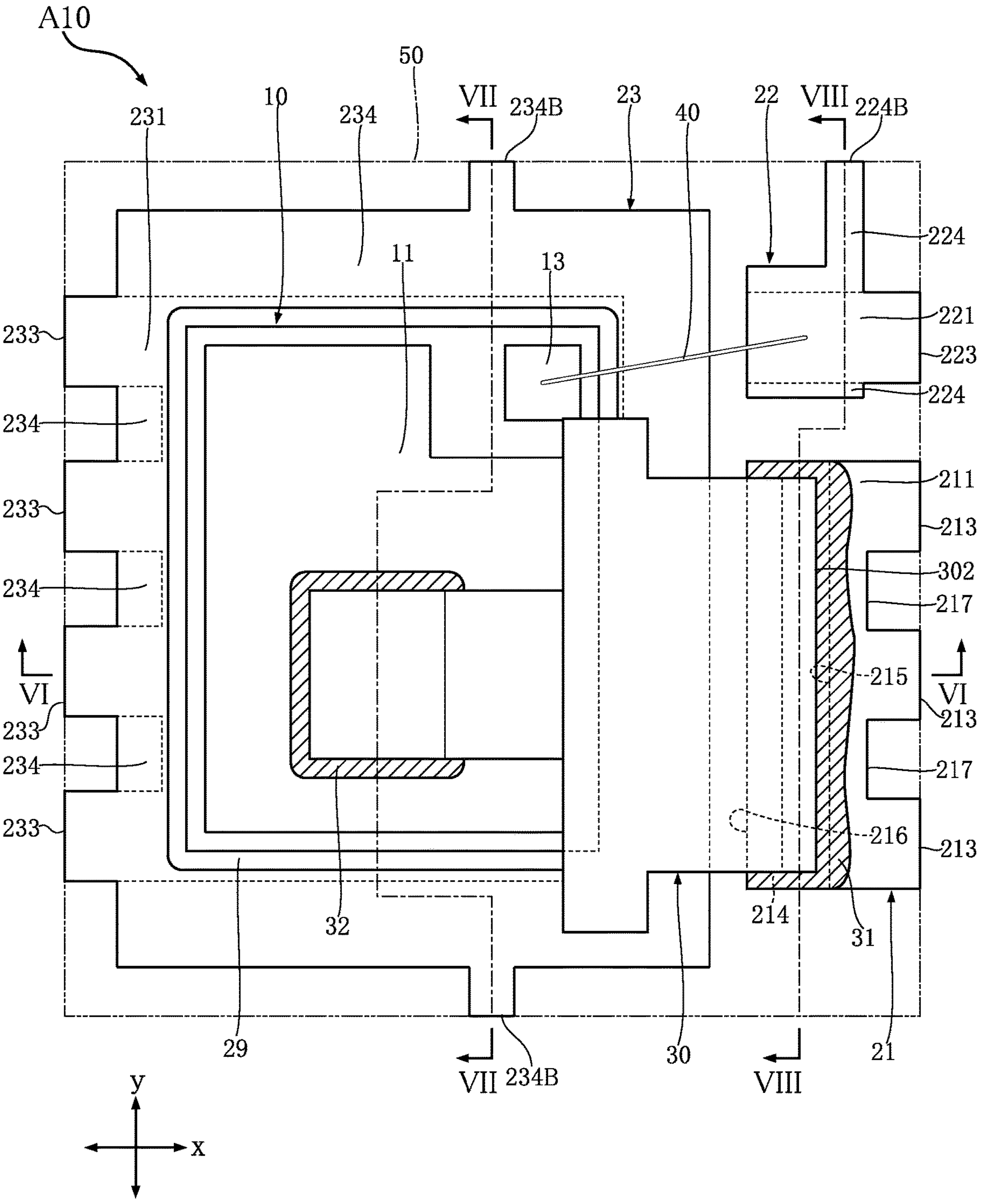
FIG. 1 is a plan view of a semiconductor device according to a first embodiment of the present disclosure in which a sealing resin is shown in a transparent manner.
Figure 2:
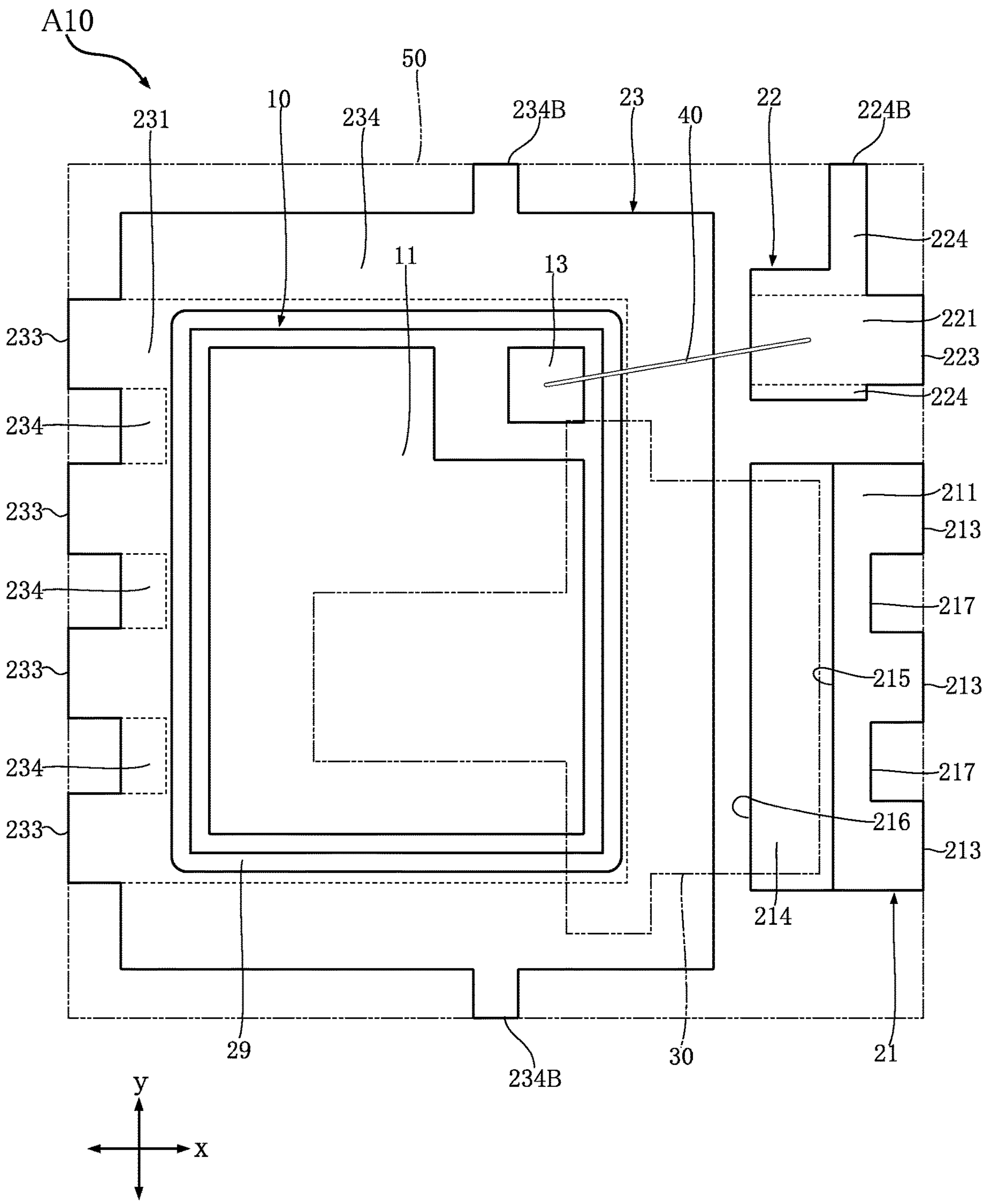
FIG. 2 is a plan view corresponding to FIG. 1 and in which a conductive member, a first conductive joining layer, and a second conductive member are also shown in a transparent manner.

A semiconductor device A10 according to a first embodiment of the present disclosure will be described with reference to FIGS. 1 to 10. The semiconductor device A10 is used in an electronic device including a power conversion circuit, such as a DC/DC converter, for example. The semiconductor device A10 includes a semiconductor element 10, a conductive member 30, a first lead 21, a second lead 22, a die pad 23, a joining layer 29, a first conductive joining layer 31, a second conductive member 32, a wire 40, and a sealing resin 50. Here, the sealing resin 50 is shown in a transparent manner in FIG. 1 for the sake of comprehension. To facilitate comprehension, in contrast to FIG. 1, the conductive member 30, the first conductive joining layer 31, and the second conductive member 32 are also shown in a transparent manner in FIG. 2. In FIGS. 1 and 2, the transparent sealing resin 50 is shown with a virtual line (two-dot chain line). In FIG. 2, the transparent conductive member 30 is shown with a virtual line. The VII-VII and VIII-VIII lines are both one-dot chain lines in FIG. 1.

In the description of the semiconductor device A10, for convenience, the thickness direction of the semiconductor element 10 will be referred to as a "thickness direction z". One direction orthogonal to the thickness direction z will be referred to as a "first direction x". A direction orthogonal to both the thickness direction z and the first direction x will be referred to as a "second direction y".

Figure 9:
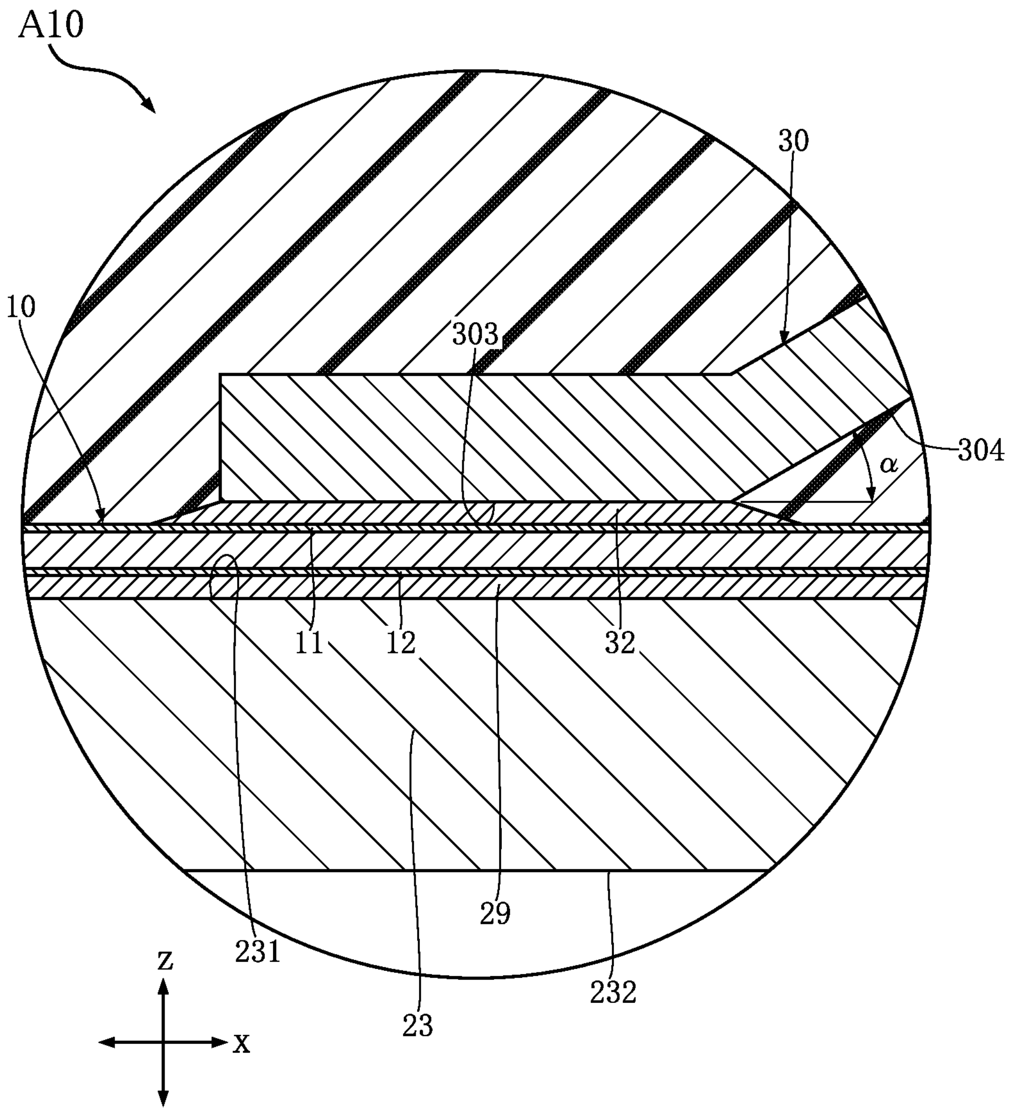
FIG. 9 is a partial enlarged view of FIG. 6.

The semiconductor element 10 is mounted on the die pad 23, as shown in FIGS. 1, 2, 6, and 7. The semiconductor element 10 is a MOSFET (Metal-Oxide-Semiconductor Field-Effect Transistor), for example. Also, the semiconductor element 10 may be a switching element such as an IGBT (Insulated Gate Bipolar Transistor) or a diode. In the description of the semiconductor device A10, the semiconductor element 10 is an n-channel vertical MOSFET. The semiconductor element 10 includes a compound semiconductor substrate. The composition of the compound semiconductor substrate includes silicon carbide (SiC). That is, the semiconductor substrate contains silicon carbide. As shown in FIGS. 2 and 9, the semiconductor element 10 includes a first electrode 11, a second electrode 12, and a third electrode (a gate electrode in the shown examples) 13.

As shown in FIG. 9, the first electrode 11 and the second electrode 12 are spaced apart from one another in the thickness direction z, with the first electrode 11 being located on one side of the second electrode 12 in the thickness direction z. A current corresponding to power converted by the semiconductor element 10 flows through the first electrode 11. In other words, the first electrode 11 corresponds to a source electrode of the semiconductor element 10. The first electrode 11 includes a plurality of metal plating layers. The first electrode 11 includes a nickel (Ni) plating layer and a gold (Au) plating layer layered on the nickel plating layer. Cases are also possible where the first electrode 11 includes a nickel plating layer, a palladium (Pd) plating layer layered on the nickel plating layer, and a gold plating layer layered on the palladium plating layer.

As shown in FIG. 9, the second electrode 12 is located on the side opposite to the first electrode 11 in the thickness direction z, and opposes or faces the die pad 23. A current that corresponds to power to be converted by the semiconductor element 10 flows through the second electrode 12. That is, the second electrode 12 corresponds to a drain electrode of the semiconductor element 10.

As shown in FIG. 2, the gate electrode 13 is located on the same side as the first electrode 11 in the thickness direction z. A gate voltage for driving the semiconductor element 10 is applied to the gate electrode 13. As viewed in the thickness direction z, the area of the gate electrode 13 is smaller than the area of the first electrode 11.

Figure 6:
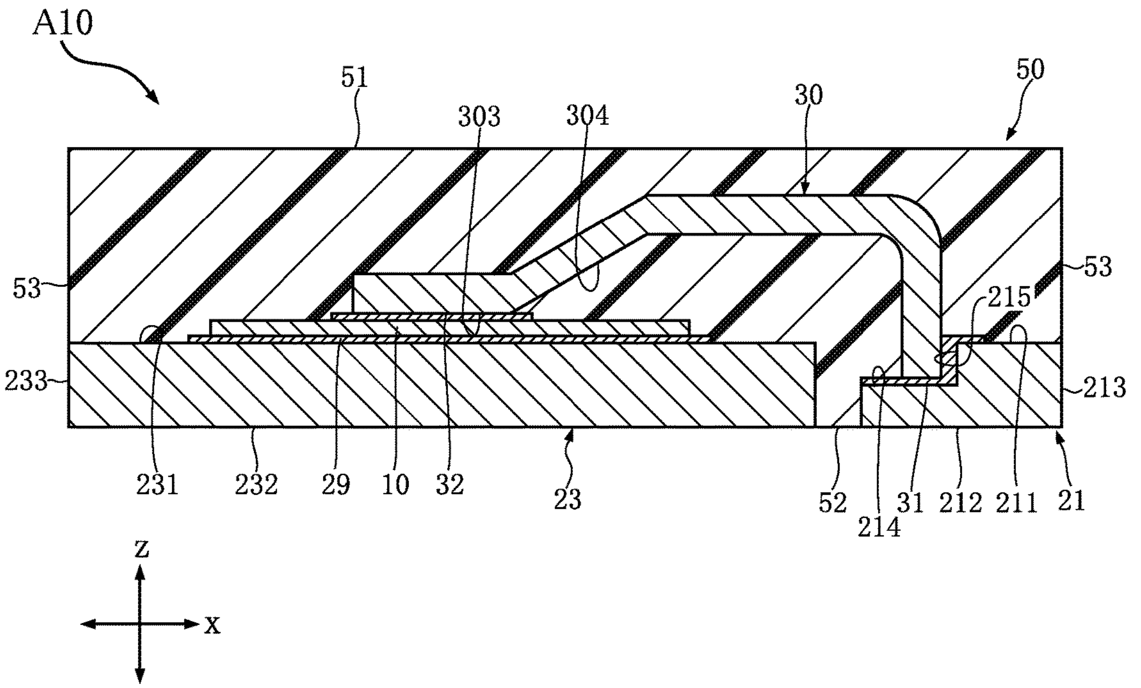
FIG. 6 is a cross-sectional view taken along line VI-VI in FIG. 1.
Figure 10:
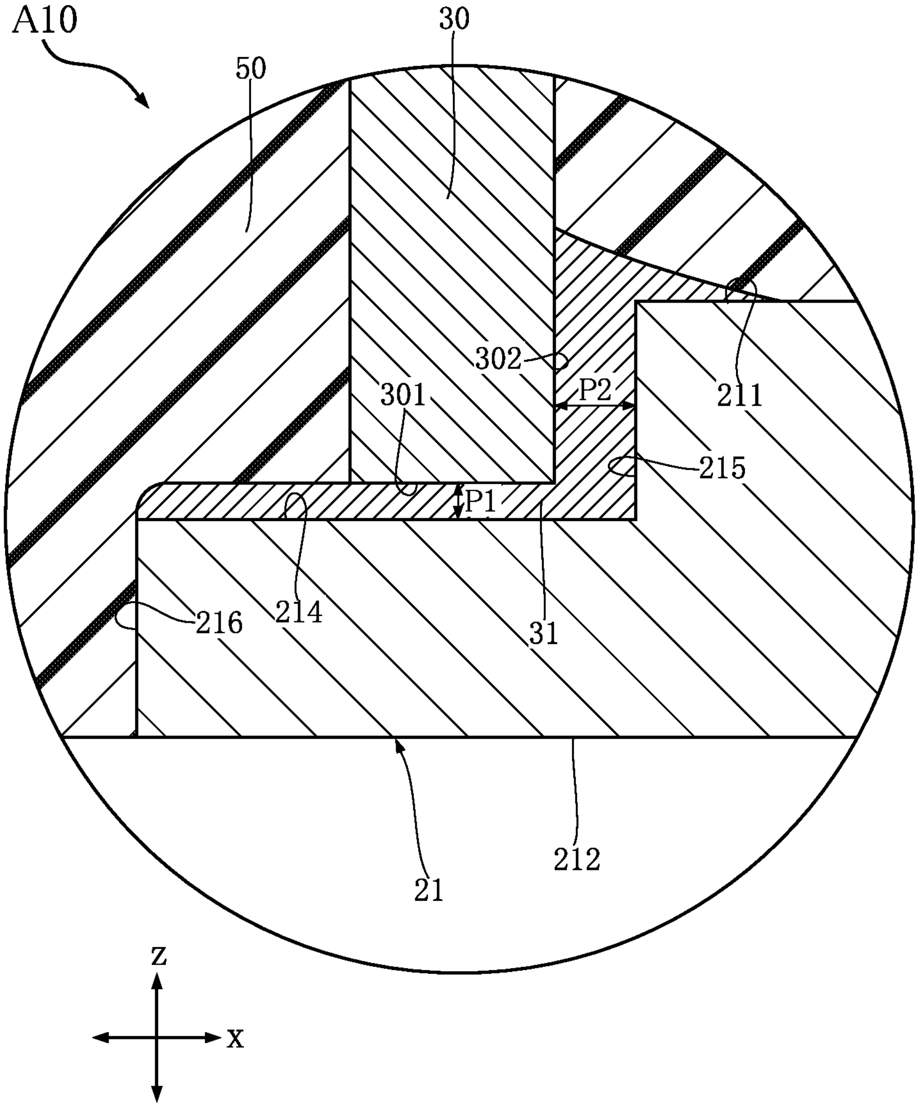
FIG. 10 is a partial enlarged view of FIG. 6.

The conductive member 30 electrically connects the first lead 21 and the first electrode 11 of the semiconductor element 10 to each other. Thus, the conductive member 30 is a part of a conduction path of the semiconductor device A10. The composition of the conductive member 30 includes copper (Cu). The conductive member 30 is a metal clip. As shown in FIGS. 1 and 6, the conductive member 30 extends across the first lead 21 and the die pad 23. As shown in FIGS. 6 and 10, the conductive member 30 includes a first surface 301, a second surface 302, a joining surface 303, and an inclined surface 304.

As shown in FIG. 10, the first surface 301 faces the first lead 21 in the thickness direction z. The second surface 302 faces the first lead 21 in the first direction x. The second surface 302 faces toward the side opposite to the side on which the semiconductor element 10 is located in the first direction x. The second surface 302 is located farther from the semiconductor element 10 than the first surface 301 is in the first direction x. The second surface 302 is connected to the first surface 301.

As shown in FIG. 9, the joining surface 303 faces the first electrode 11 of the semiconductor element 10. The inclined surface 304 is located between the first surface 301 and the joining surface 303 in the first direction x, and is connected to the joining surface 303. The inclined surface 304 is inclined at an inclination angle α relative to the joining surface 303 so as to extend farther away from the semiconductor device 10 in the thickness direction z as the distance from the joining surface 303 increases in the first direction x. As an example, the inclination angle α is 30 degrees or more and 60 degrees or less.

The first lead 21, the second lead 22, and the die pad 23 form the conduction path of the semiconductor device A10 together with the conductive member 30. The first lead 21, the second lead 22, and the die pad 23 are formed from the same lead frame. The lead frame is made of copper or a copper alloy. Thus, the composition of the first lead 21, the second lead 22, and the die pad 23 includes copper.

Figure 3:
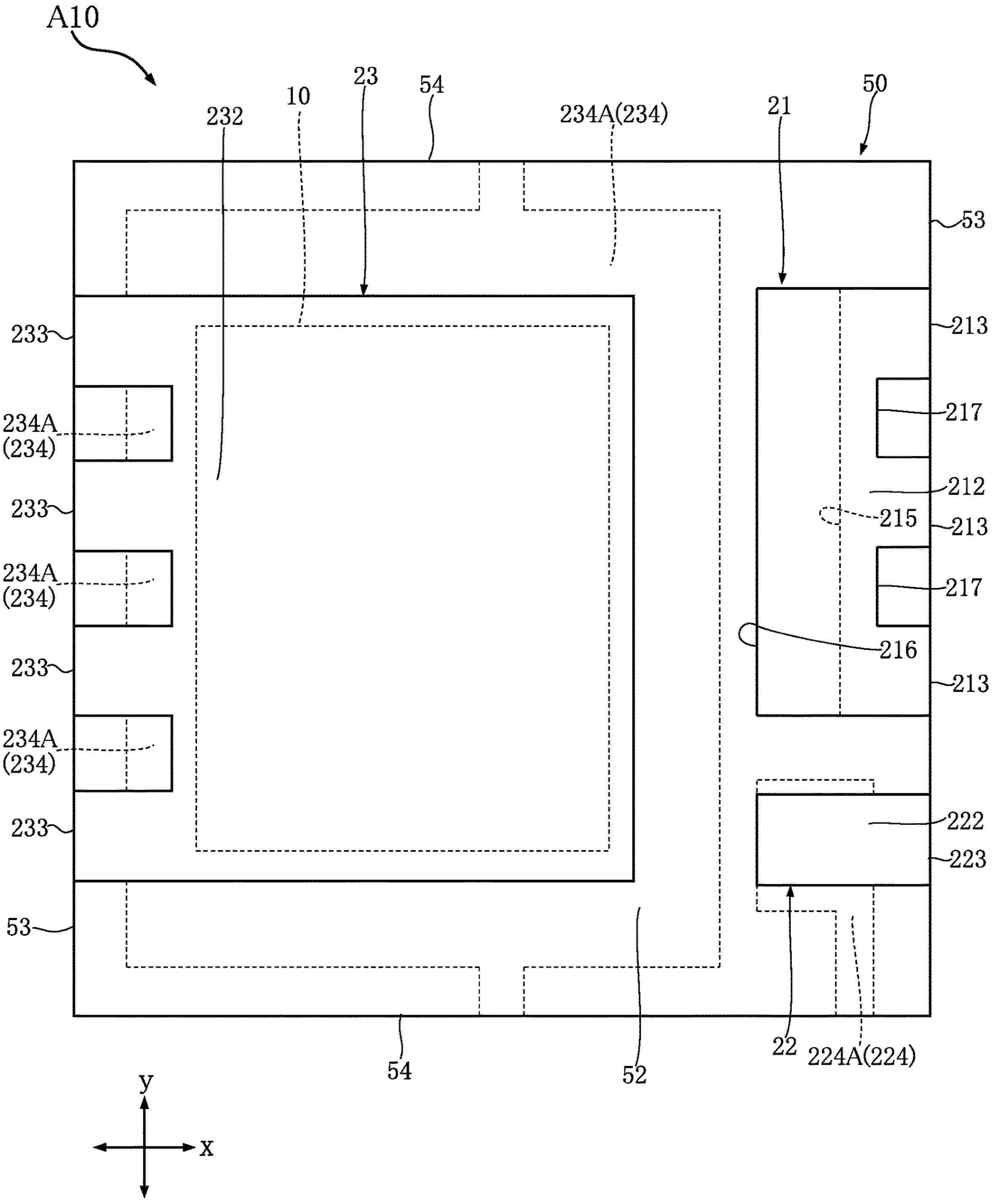
FIG. 3 is a bottom view of the semiconductor device shown in FIG. 1.

As shown in FIGS. 1 and 2, the first lead 21 is located on one side in the first direction x. The first lead 21 is electrically connected to the first electrode 11 of the semiconductor element 10 via the conductive member 30. Thus, the first lead 21 is a source terminal of the semiconductor device A10. As shown in FIGS. 1 to 3, the first lead 21 includes a first obverse surface 211, a first mounting surface 212, a plurality of first side surfaces 213, a third surface 214, a fourth surface 215, a fifth surface 216, and a plurality of recesses 217.

As shown in FIGS. 6 and 10, the third surface 214 faces toward the one side in the thickness direction z (for example, the upper side in FIG. 10). In regards to this, as shown in FIG. 9, the first electrode 11 includes a surface facing the outside of the semiconductor element 10 (that is, one side in the thickness direction z) and a surface facing the inside of the semiconductor element 10 (that is, another side in the thickness direction z). In other words, in the thickness direction z, the side the third surface 214 faces toward and the side the outer surface of the first electrode 11 faces toward are the same. The third surface 214 faces the first surface 301 of the conductive member 30.

As shown in FIGS. 6 and 10, the fourth surface 215 faces toward the side on which the semiconductor element 10 is located in the first direction x. The fourth surface 215 faces the second surface 302 of the conductive member 30. The fourth surface 215 is connected to the third surface 214. The first lead 21 is provide with a notch defined by the third surface 214 and the fourth surface 215.

As shown in FIGS. 6 and 10, the first obverse surface 211 faces toward the same side as the third surface 214 in the thickness direction z. The first obverse surface 211 is located on the side of the fourth surface 215 opposite to the third surface 214 in the thickness direction z. The first obverse surface 211 is located farther from the semiconductor element 10 than the third surface 214 is in the first direction x. The first obverse surface 211 is connected to the fourth surface 215. A plating layer having a composition including nickel, silver (Ag), or the like may be provided on the first obverse surface 211.

As shown in FIGS. 6 and 10, the first mounting surface 212 faces toward the opposite side to the third surface 214 in the thickness direction z. As shown in FIG. 3, the first mounting surface 212 is exposed from the sealing resin 50. The third surface 214 is located between the first obverse surface 211 and the first mounting surface 212 in the thickness direction z. As viewed in the thickness direction z, the third surface 214 overlaps with the first mounting surface 212 (see FIGS. 2 and 3). A plating layer having a composition including tin (Sn) or the like may be provided on the first mounting surface 212.

As shown in FIGS. 6 and 10, the fifth surface 216 faces the same side as the fourth surface 215 in the first direction x. The fifth surface 216 is located between the first mounting surface 212 and the third surface 214 in the thickness direction z. The fifth surface 216 is connected to the first mounting surface 212 and the third surface 214. The fifth surface 216 is located on the side of the third surface 214 opposite to the fourth surface 215 in the first direction x. The fifth surface 216 is located closer to the semiconductor element 10 than the fourth surface 215 is in the first direction x.

Figure 5:
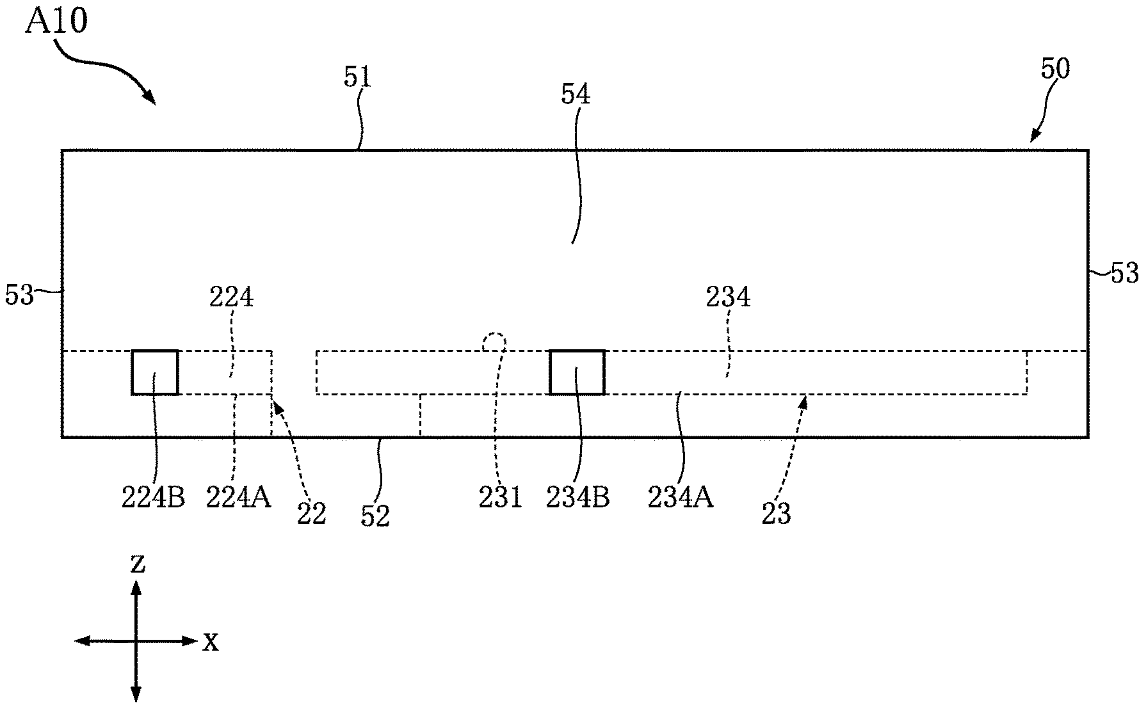
FIG. 5 is a back view of the semiconductor device shown in FIG. 1.

As shown in FIGS. 2 and 6, the plurality of first side surfaces 213 face toward the side opposite to the side on which the semiconductor element 10 is located in the first direction x. The first side surfaces 213 are connected to the first obverse surface 211 and the first mounting surface 212. The first side surfaces 213 are arranged along the second direction y. As shown in FIG. 5, the first side surfaces 213 are exposed from the sealing resin 50.

As shown in FIGS. 2 and 3, each recess 217 is recessed in the first direction x between two first side surfaces 213 that are adjacent in the second direction y. The recesses 217 are filled with the sealing resin 50.

As shown in FIGS. 1 and 2, the second lead 22 is spaced apart from the first lead 21 in the second direction y. The second lead 22 is electrically connected to the gate electrode 13 of the semiconductor element 10. Thus, the second lead 22 is a gate terminal of the semiconductor device A10. As shown in FIGS. 1 to 3, the second lead 22 includes a second obverse surface 221, a second mounting surface 222, a second side surface 223, and a thin portion 224.

Figure 8:
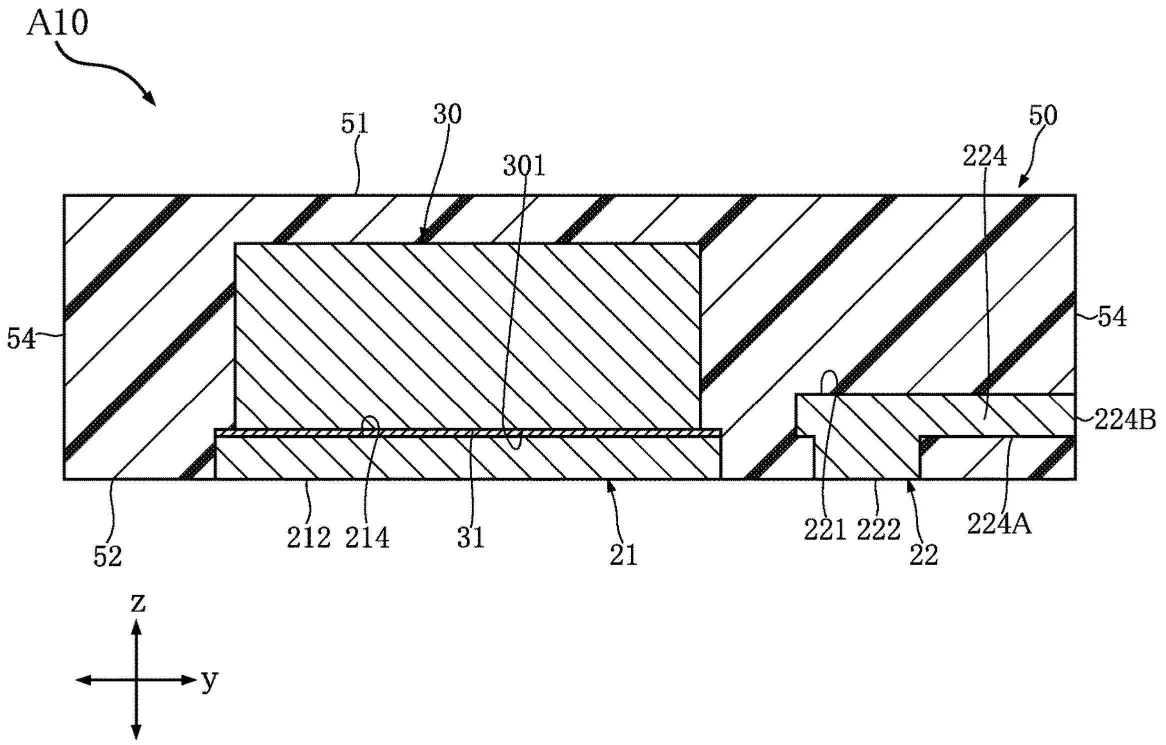
FIG. 8 is a cross-sectional view taken along line VIII-VIII in FIG. 1.

As shown in FIG. 8, the second obverse surface 221 faces toward the same side as the third surface 214 of the first lead 21 in the thickness direction z. The position of the second obverse surface 221 in the thickness direction z corresponds to the position of the first obverse surface 211 of the first lead 21 in the thickness direction z. A plating layer having a composition including nickel, silver, or the like may be provided on the second obverse surface 221.

As shown in FIG. 8, the second mounting surface 222 faces toward the opposite side to the second obverse surface 221 in the thickness direction z. As shown in FIG. 3, the second mounting surface 222 is exposed from the sealing resin 50. A plating layer having a composition including tin or the like may be provided on the first mounting surface 212.

Figure 4:
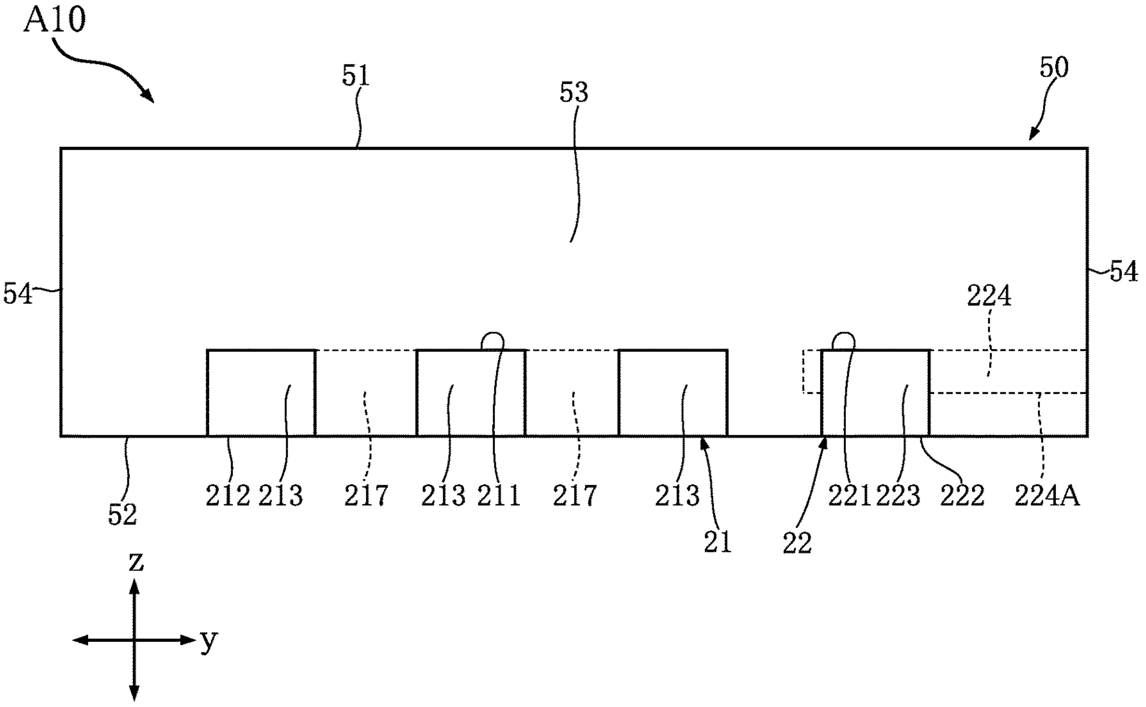
FIG. 4 is a right-side view of the semiconductor device shown in FIG. 1.

As shown in FIGS. 1 and 2, the second side surface 223 faces toward the same side as the first side surfaces 213 of the first lead 21 in the first direction x. The second side surface 223 is connected to the second obverse surface 221 and the second mounting surface 222. As shown in FIG. 4, the second side surface 223 is exposed from the sealing resin 50.

As shown in FIG. 3, the thin portion 224 includes an overhang shape and extends from the second mounting surface 222 in a direction orthogonal to the thickness direction z, as viewed in the thickness direction z. A portion of the second obverse surface 221 is included in the thin portion 224. As shown in FIG. 8, the thin portion 224 includes an intermediate surface 224A and an end surface 224B. The intermediate surface 224A faces toward the opposite side to the second obverse surface 221 in the thickness direction z. The intermediate surface 224A is located between the second obverse surface 221 and the second mounting surface 222 in the thickness direction z. The intermediate surface 224A is in contact with the sealing resin 50. The end surface 224B is connected to the second obverse surface 221 and the intermediate surface 224A, and faces toward the second direction y. As shown in FIG. 5, the end surface 224B is exposed from the sealing resin 50. The area of the end surface 224B is smaller than the area of the second side surface 223.

As shown in FIGS. 1 and 2, the die pad 23 is spaced apart from the first lead 21 and the second lead 22 in the first direction x. The die pad 23 is electrically connected to the second electrode 12 of the semiconductor element 10. Accordingly, the die pad 23 is a drain terminal of the semiconductor device A10. As shown in FIGS. 1 to 3, the die pad 23 includes an installation surface 231, a reverse surface 232, a plurality of peripheral surfaces 233, and thin portions 234.

As shown in FIG. 6, the installation surface 231 faces toward the same side as the third surface 214 of the first lead 21 in the thickness direction z. The position of the installation surface 231 in the thickness direction z corresponds to the position of the first obverse surface 211 of the first lead 21 in the thickness direction z. The semiconductor element 10 is mounted on the installation surface 231. A plating layer having a composition including nickel, silver, or the like may be provided on the installation surface 231.

Figure 7:
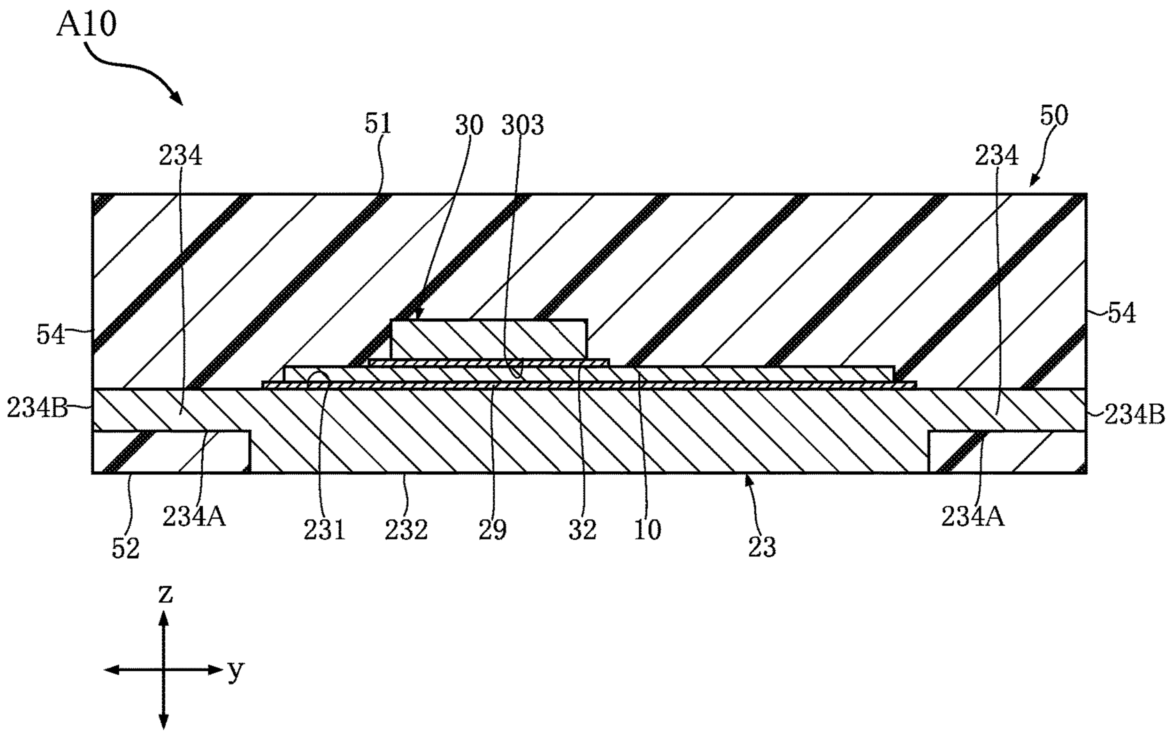
FIG. 7 is a cross-sectional view taken along line VII-VII in FIG. 1.

As shown in FIGS. 6 and 7, the reverse surface 232 faces toward the side opposite to the side on which the semiconductor element 10 is located in the thickness direction z. As shown in FIG. 3, the reverse surface 232 is exposed from the sealing resin 50. As viewed in the thickness direction z, the reverse surface 232 overlaps with the semiconductor element 10. A plating layer having a composition including tin or the like may be provided on the reverse surface 232.

As shown in FIGS. 1 and 2, the peripheral surfaces 233 face toward the opposite side to the first side surfaces 213 of the first lead 21 in the first direction x. The peripheral surfaces 233 are connected to the installation surface 231 and the reverse surface 232. The peripheral surfaces 233 are arranged along the second direction y. As shown in FIG. 6, the peripheral surfaces 233 are exposed from the sealing resin 50.

As shown in FIG. 3, each of the thin portions 234 includes an eave shape and extends from the reverse surface 232 in a direction orthogonal to the thickness direction z, as viewed in the thickness direction z. A portion of the installation surface 231 is included in the thin portions 234. As shown in FIG. 7, each thin portion 234 includes an intermediate surface 234A and a pair of end surfaces 234B. The intermediate surface 234A faces toward the opposite side to the installation surface 231 in the thickness direction z. Each intermediate surface 234A is located between the installation surface 231 and the reverse surface 232 in the thickness direction z. The intermediate surfaces 234A are in contact with the sealing resin 50. The pair of end surfaces 234B are connected to the installation surface 231 and the intermediate surface 234A, and face toward opposite sides in the second direction y. The pair of end surfaces 234B are spaced apart from each other in the second direction y. The pair of end surfaces 234B are exposed from the sealing resin 50. The area of each end surface 234B is smaller than the area of each peripheral surface 233.

As shown in FIG. 9, the joining layer 29 is interposed between the installation surface 231 of the die pad 23 and the second electrode 12 of the semiconductor element 10. The joining layer 29 is in contact with the installation surface 231 and the second electrode 12. The joining layer 29 conductively joins the die pad 23 and the second electrode 12 to each other. Accordingly, the die pad 23 is electrically connected to the second electrode 12. The composition of the joining layer 29 includes tin. The joining layer 29 is made of solder.

The first conductive joining layer 31 conductively joins the first lead 21 and the conductive member 30 to each other. In FIG. 1, the first conductive joining layer 31 is indicated by a region marked with oblique lines. As shown in FIG. 10, the first conductive joining layer 31 includes a portion located between the first surface 301 of the conductive member and the third surface 214 of the first lead 21. This portion is in contact with the first surface 301 and the third surface 214. Furthermore, the first conductive joining layer 31 includes a portion located between the second surface 302 of the conductive member 30 and the fourth surface 215 of the first lead 21. This portion is in contact with the second surface 302 and the fourth surface 215. The composition of the first conductive joining layer 31 includes tin. The first conductive joining layer 31 is made of solder.

As shown in FIG. 10, the largest value of a first interval P1 from the first surface 301 of the conductive member 30 to the third surface 214 of the first lead 21 is smaller than the largest value of a second interval P2 from the second surface 302 of the conductive member 30 to the fourth surface 215 of the first lead 21. Thus, the thickness of the portion of the first conductive joining layer 31 located between the first surface 301 and the third surface 214 is smaller than the thickness of the portion of the first conductive joining layer 31 located between the second surface 302 and the fourth surface 215.

The second conductive member 32 conductively joins the first electrode 11 of the semiconductor element 10 and the conductive member 30 to each other. In FIG. 1, the second conductive member 32 is indicated by a region marked with oblique lines. As shown in FIG. 9, the second conductive member 32 is interposed between the first electrode 11 and the joining surface 303 of the conductive member 30. The second conductive member 32 is in contact with the first electrode 11 and the joining surface 303. The composition of the second conductive member 32 includes tin. The second conductive member 32 is made of solder.

As shown in FIG. 1, the wire 40 is conductively joined to the gate electrode 13 of the semiconductor element 10 and the second obverse surface 221 of the second lead 22. Thus, the second lead 22 is electrically connected to the gate electrode 13. The composition of the wire 40 includes gold. Also, cases are possible where the composition of the wire 40 includes aluminum (Al) or copper.

As shown in FIGS. 1 and 6, the sealing resin 50 covers the semiconductor element 10, the conductive member 30, and the wire 40, and portions of the first lead 21, the second lead 22, and the die pad 23. The sealing resin 50 includes electrical insulating properties. The sealing resin 50 is made of a material including a black epoxy resin, for example. The sealing resin 50 includes a top surface 51, a bottom surface 52, a pair of first side surfaces 53, and a pair of second side surfaces 54.

As shown in FIGS. 6 and 7, the top surface 51 faces toward the same side as the installation surface 231 of the die pad 23 in the thickness direction z. As shown in FIGS. 6 and 7, the bottom surface 52 faces toward the opposite side to the top surface 51 in the thickness direction z. As shown in FIG. 3, the first mounting surface 212 of the first lead 21, the second mounting surface 222 of the second lead 22, and the reverse surface 232 of the die pad 23 are exposed from the bottom surface 52.

As shown in FIGS. 3, 5, and 6, the pair of first side surfaces 53 face toward opposite sides to each other in the first direction x, and are spaced apart from each other in the first direction x. The pair of first side surfaces 53 are connected to the top surface 51 and the bottom surface 52. The plurality of first side surfaces 213 of the first lead 21 and the second side surface 223 of the second lead 22 are exposed from one side surface 53 of the pair of first side surfaces 53. The peripheral surfaces 233 of the die pad 23 are exposed from the other first side surface 53 of the pair of first side surfaces 53. The first side surfaces 213, the second side surface 223, and the peripheral surfaces 233 are flush with the corresponding one of the pair of first side surfaces 53.

As shown in FIGS. 3, 4, 7, and 8, the pair of second side surfaces 54 face opposite sides to each other in the second direction y, and are spaced apart from each other in the second direction y. The pair of second side surfaces 54 are connected to the top surface 51 and the bottom surface 52. The pair of end surfaces 234B of the die pad 23 are exposed from the pair of second side surfaces 54. The end surface 224B of the second lead 22 is exposed from one second side surface 54 of the pair of second side surfaces 54. The pair of end surfaces 234B and the end surface 224B are flush with the corresponding one of the pair of second side surfaces 54.

Next, a semiconductor device A11 that is a variation of the semiconductor device A10 will be described based on FIG. 11. Here, the position of FIG. 11 is the same as FIG. 10.

Figure 11:
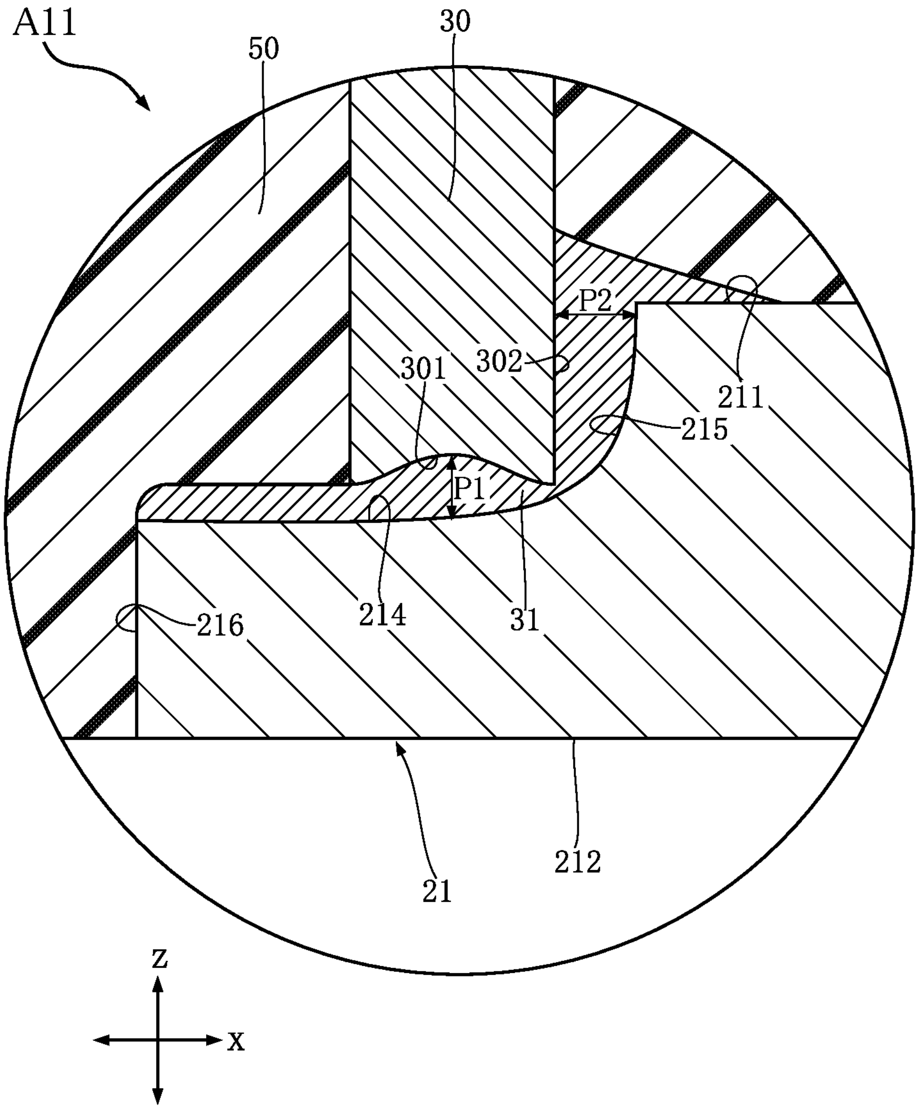
FIG. 11 is a partial enlarged cross-sectional view of a variation of the semiconductor device shown in FIG. 1.

As shown in FIG. 11, in the semiconductor device A11, the configurations of the first surface 301 of the conductive member 30 and the third surface 214 and the fourth surface 215 of the first lead 21 differ from those of the semiconductor device A10. The first surface 301 and the third surface 214 are curved surfaces that are recessed toward opposite sides to each other in the thickness direction z. The fourth surface 215 is a curved surface that is recessed in the first direction x. The fourth surface 215 is smoothly connected to the third surface 214. The third surface 214 and the fourth surface 215 each form portions of one curved surface provided on the first lead 21.

The first surface 301, the third surface 214, and the fourth surface 215 of the semiconductor device A11 are obtained by etching a lead frame that forms the base of the first lead 21 and the conductive member 30. On the other hand, the third surface 214 and the fourth surface 215 of the semiconductor device A10 are obtained by performing pressing on a lead frame forming the base of the first lead 21.

Next, operation and effects of the semiconductor device A10 will be described.

The semiconductor device A10 is provided with the first lead 21 and the conductive member 30 that electrically connects the first lead 21 and the first electrode 11 of the semiconductor element 10 to each other, and the first conductive joining layer 31 that conductively joins the first lead 21 and the conductive member 30 to each other. The conductive member 30 includes the first surface 301 that faces the first lead 21 in the thickness direction z and the second surface 302 that faces the first lead 21 in the first direction x. The first lead 21 includes the third surface 214 that faces the first surface 301 and the fourth surface 215 that faces the second surface 302. The first conductive joining layer 31 is in contact with the first surface 301 and the third surface 214. By employing this configuration, when the conductive member 30 is conductively joined to the first lead 21 via the first conductive joining layer 31, if the conductive member 30 attempts to shift in the first direction x, the second surface 302 comes into contact with the fourth surface 215, or alternatively, the first conductive joining layer 31 is sandwiched between the second surface 302 and the fourth surface 215. Accordingly, displacement of the conductive member 30 in the first direction x is regulated, and thus deviation of the conductive member 30 relative to the first electrode 11 in the first direction x can be suppressed. Accordingly, with the semiconductor device A10, deviation of the conductive member 30 relative to an electrode (first electrode 11) of the semiconductor element 10 can be suppressed.

The first conductive joining layer 31 is also in contact with the second surface 302 of the conductive member 30 and the fourth surface 215 of the first lead 21. Accordingly, the joining area between the conductive member 30 and the first lead 21 is improved. Thus, the joining strength between the conductive member 30 and the first lead 21 can be improved.

The largest value of the first interval P1 from the first surface 301 of the conductive member 30 to the third surface 214 of the first lead 21 is smaller than the largest value of the second interval P2 from the second surface 302 of the conductive member 30 to the fourth surface 215 of the first lead 21. In this configuration, when the conductive member 30 is conductively joined to the first lead 21 via the first conductive joining layer 31, a comparatively large amount of compression stress acts on the portion of the first conductive joining layer 31 located between the first surface 301 and the third surface 214. Thus, the joining strength between the conductive member 30 and the first lead 21 is improved. Furthermore, in this configuration, when the conductive member 30 is conductively joined to the first lead 21 via the first conductive joining layer 31, if the conductive member 30 attempts to deviate in the first direction x, the second surface 302 receives a comparatively large reactionary force from the first conductive joining layer 31. Thus, deviation of the conductive member 30 relative to the first electrode 11 of the semiconductor element 10 in the first direction x is more effectively suppressed.

In the semiconductor device A11, the first surface 301 of the conductive member 30 is a curved surface that is recessed in the thickness direction z. By employing this configuration, the area of contact between the conductive member 30 and the first conductive joining layer 31 is improved. Furthermore, an anchoring effect resulting from the first surface 301 is exhibited in the first conductive joining layer 31. Accordingly, the joining strength between the conductive member 30 and the first lead 21 can be further improved.

The first conductive joining layer 31 is in contact with the first obverse surface 211 of the first lead 21. In this configuration, the first conductive joining layer 31 is filled into the gap between the first surface 301 and the second surface 302 of the conductive member 30 and the third surface 214 and the fourth surface 215 of the first lead 21. Thus, an improvement in the joining strength between the conductive member 30 and the first lead 21 can be reliably realized.

The first lead 21 includes the first mounting surface 212 that faces toward the opposite side to the third surface 214 in the thickness direction z. The third surface 214 overlaps with the first mounting surface 212 as viewed in the thickness direction z. By employing this configuration, when the conductive member 30 of the first lead 21 is conductively joined to the first conductive joining layer 31, the entirety of the first mounting surface 212 is supported by the workpiece, and thus, when compressive force from the conductive member 30 acts on the third surface 214, reactionary force from the workpiece acts on the first mounting surface 212. Accordingly, bending that occurs in the first lead 21 can be suppressed.

The compositions of the first conductive joining surface 31, the second conductive member 32, and the joining layer 29 each include tin. Thus, in the step of conductively joining the conductive member 30 to the first lead 21 and the first electrode 11 of the semiconductor element 10, the semiconductor element 10 can be joined to the die pad 23.

The first lead 21 includes the first side surfaces 213 that face toward the side opposite to the side on which the semiconductor element 10 is located in the first direction x. The first side surfaces 213 are exposed from the sealing resin 50. By employing this configuration, when mounting the semiconductor device A10 onto a wiring board, solder adheres to the first mounting surface 212 and the first side surfaces 213 of the first lead 21. Thus, a solder fillet that covers the first side surfaces 213 is formed. Accordingly, an improvement in the mounting strength of the semiconductor device A10 to a wiring board can be realized.

The reverse surface 232 of the die pad 23 is exposed from the sealing resin 50. Accordingly, the heat dissipation properties of the semiconductor device A10 can be improved.

The composition of the conductive member 30 includes copper. Thus, compared to a wire having a composition including aluminum, the electrical resistance of the conductive member 30 can be reduced. This is favorable for allowing a larger current to flow through the semiconductor element 10.

A semiconductor device A20 according to a second embodiment of the present disclosure will be described based on FIGS. 12 to 15. In these figures, elements that are the same as or similar to those of the above semiconductor element A10 are given the same reference numerals, and redundant description thereof is omitted. Here, for the sake of comprehension, the sealing resin 50 is shown in a transparent manner in FIG. 12.

The configurations of the first lead 21 and the conductive member 30 of the semiconductor device A20 differ from those of the aforementioned semiconductor device A10.

Figure 12:
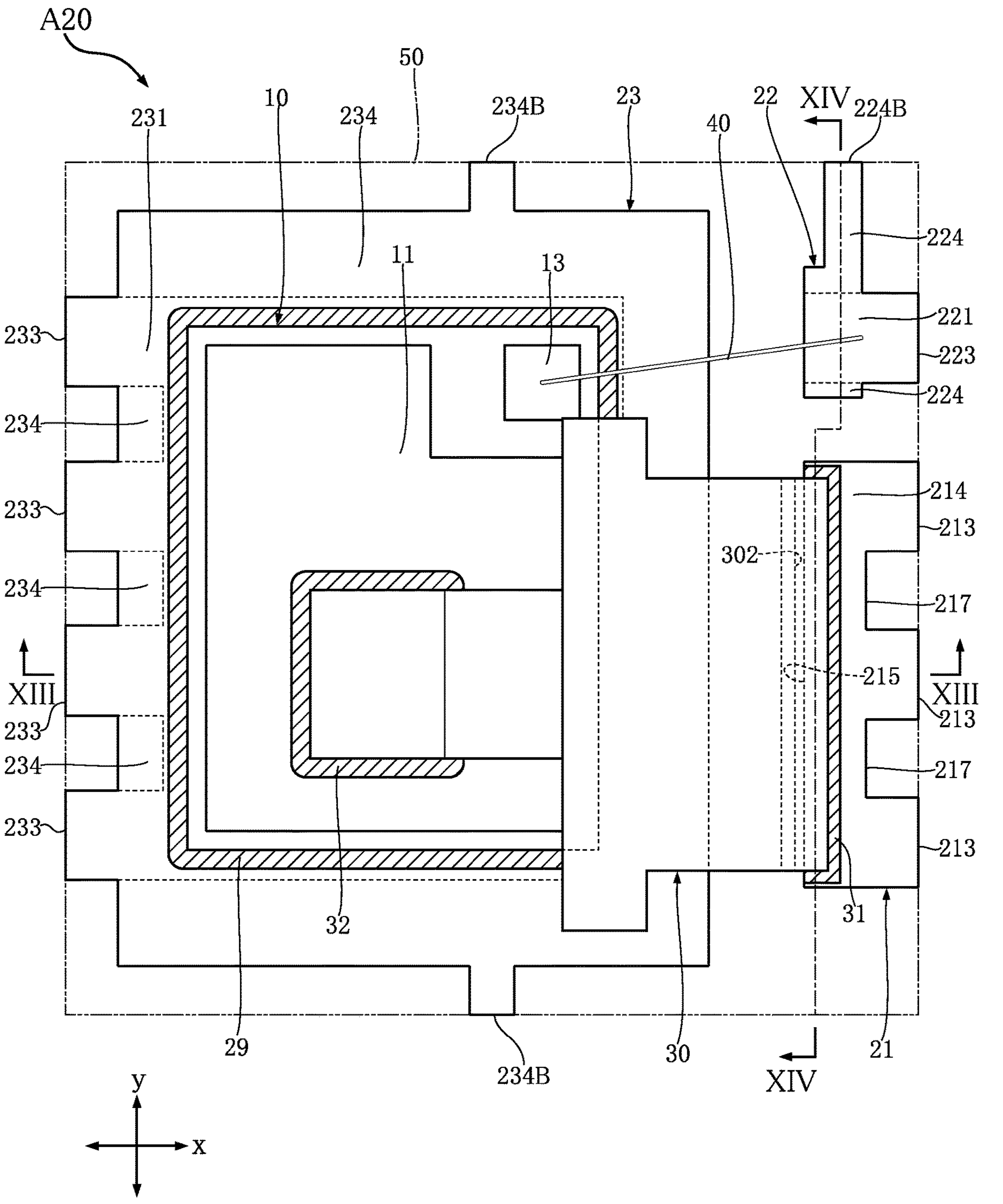
FIG. 12 is a plan view of a semiconductor device according to a second embodiment of the present disclosure in which a sealing resin is shown in a transparent manner.
Figure 13:
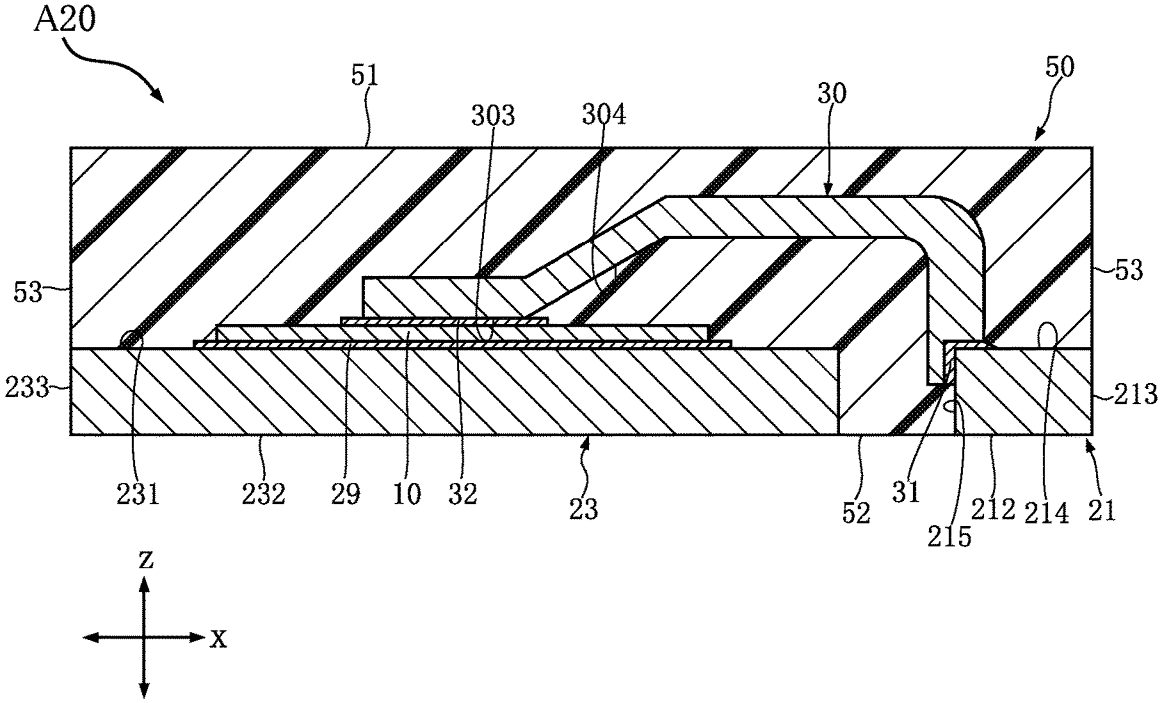
FIG. 13 is a cross-sectional view taken along line XIII-XIII in FIG. 12.
Figure 14:
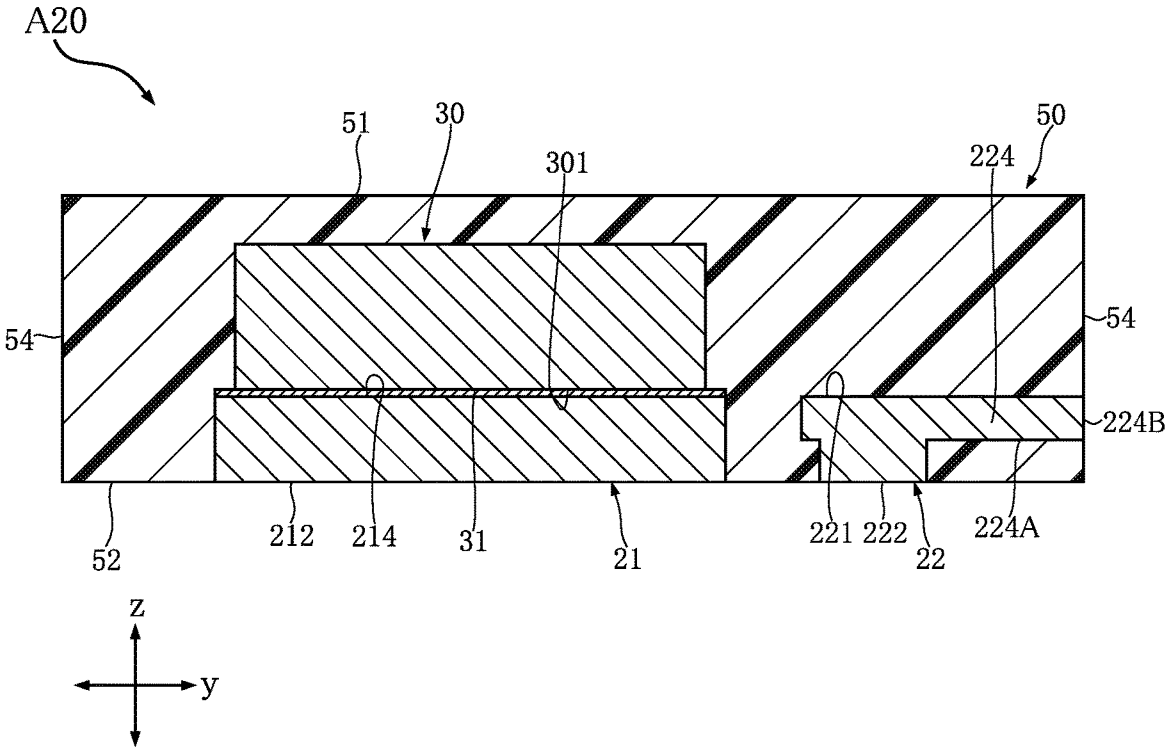
FIG. 14 is a cross-sectional view taken along line XIV-XIV in FIG. 12.
Figure 15:
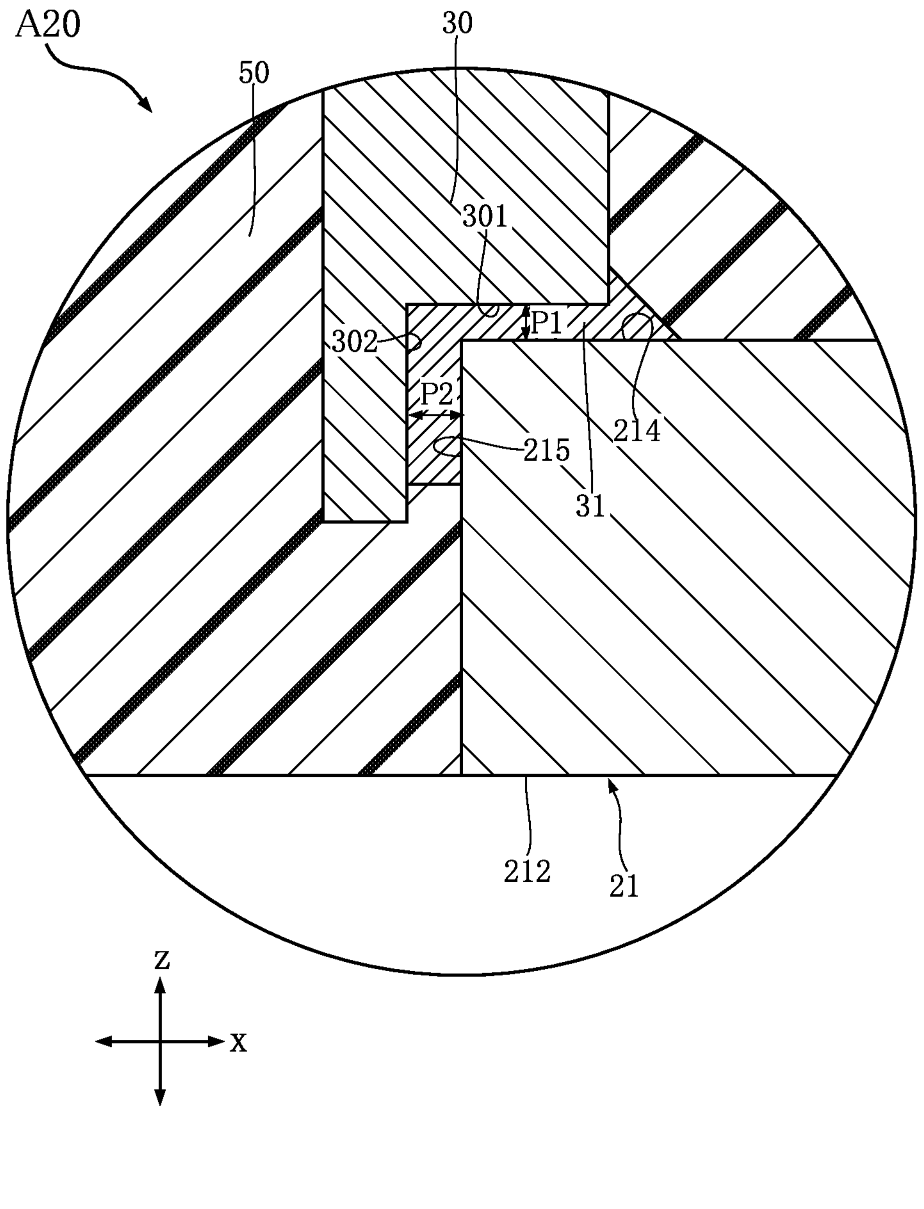
FIG. 15 is a partial enlarged view of FIG. 13.

As shown in FIGS. 12, 13, and 15, in the semiconductor device A20, the first lead 21 does not have the first obverse surface 211. The third surface 214 of the first lead 21 is connected to the plurality of first side surfaces 213. The fourth surface 215 of the first lead 21 is located between the first mounting surface 212 and the third surface 214 in the thickness direction z. The fourth surface 215 is connected to the first mounting surface 212.

As shown in FIG. 15, the first surface 301 of the conductive member 30 is located on the side of the second surface 302 toward which the third surface 214 of the first lead 21 faces in the thickness direction z. The first surface 301 is located farther from the semiconductor element 10 than the second surface 302 is in the first direction x. The conductive member 30 is provided with a notch defined by the first surface 301 and the second surface 302.

Next, operation and effects of the semiconductor device A20 will be described.

The semiconductor device A20 includes the first lead 21, the conductive member 30 that electrically connects the first lead 21 and the first electrode 11 of the semiconductor element 10 to each other, and the first conductive joining layer 31 that conductively joins the first lead 21 and the conductive member 30. The conductive member 30 includes the first surface 301 that faces the first lead 21 in the thickness direction z and the second surface 302 that faces the first lead 21 in the first direction x. The first lead 21 includes the third surface 214 that faces the first surface 301 and the fourth surface 215 that faces the second surface 302. The first conductive joining layer 31 is in contact with the first surface 301 and the third surface 214. Thus, with the semiconductor device A20 as well, deviation of the conductive member 30 relative to an electrode (first electrode 11) of the semiconductor element 10 can be suppressed. Furthermore, as a result of the semiconductor device A20 having a similar configuration to the semiconductor device A10, the semiconductor device A20 also exhibits operation and effects realized by the configuration of the semiconductor device A10.

By employing the configuration of the semiconductor device A20, the length of the first lead 21 in the first direction x can be shorter than in the semiconductor device A10. Accordingly, the interval between the first lead 21 and the die pad 23 in the first direction x can be further increased. Thus, when forming the sealing resin 50, the density of the resin filled between the first lead 21 and the die pad 23 in the first direction x can be increased.

A semiconductor device A30 according to a third embodiment of the present disclosure will be described based on FIGS. 16 to 18. In these figures, elements that are the same as or similar to those of the above semiconductor element A10 are given the same reference numerals, and redundant description thereof is omitted. Here, for the sake of comprehension, the sealing resin 50 is shown in a transparent manner in FIG. 16.

The configurations of the conductive member 30 and the first conductive joining layer 31 of the semiconductor device A20 differ from those of the configurations of the above semiconductor device A10.

Figure 16:
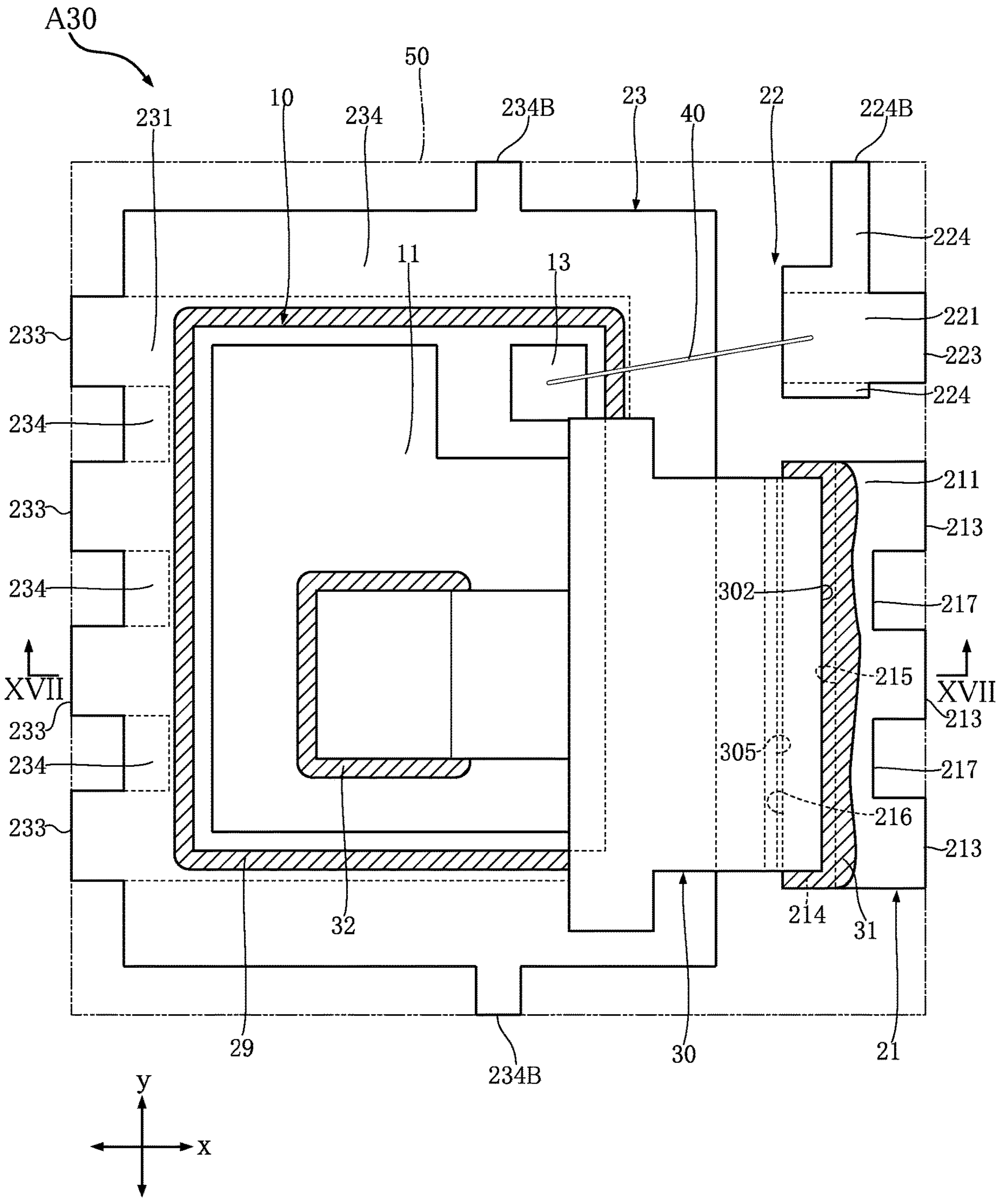
FIG. 16 is a plan view of a semiconductor device according to a third embodiment of the present disclosure in which a sealing resin is shown in a transparent manner.
Figure 17:
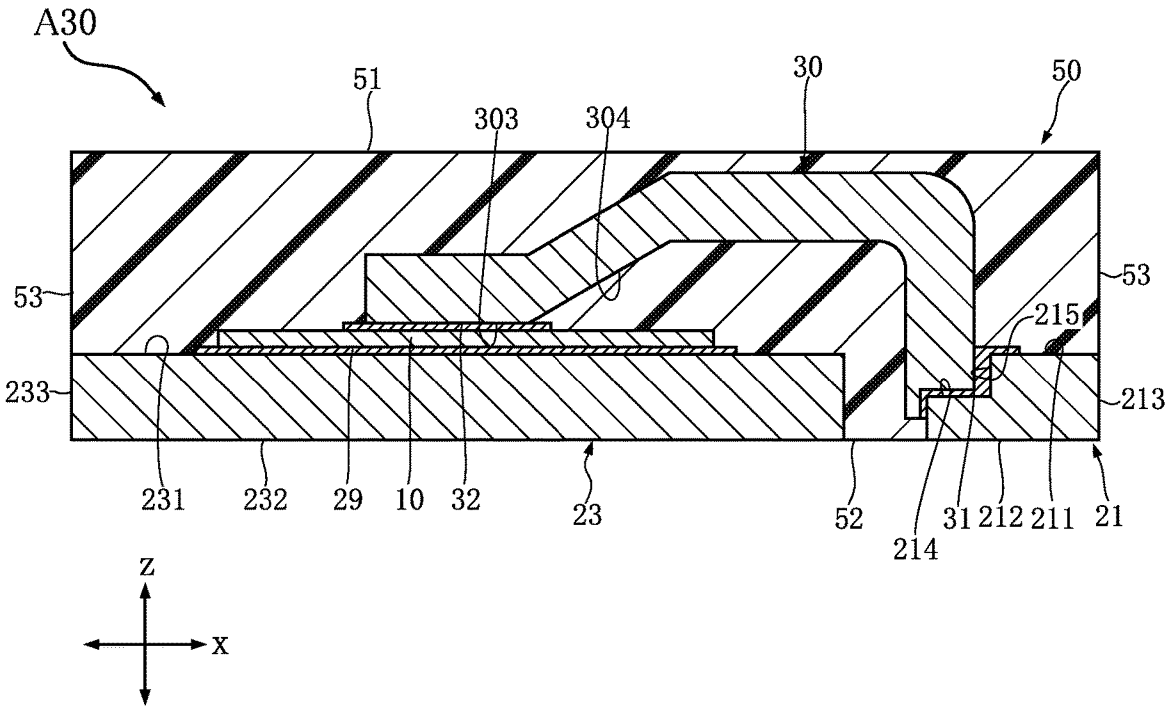
FIG. 17 is a cross-sectional view taken along line XVII-XVII in FIG. 16.
Figure 18:
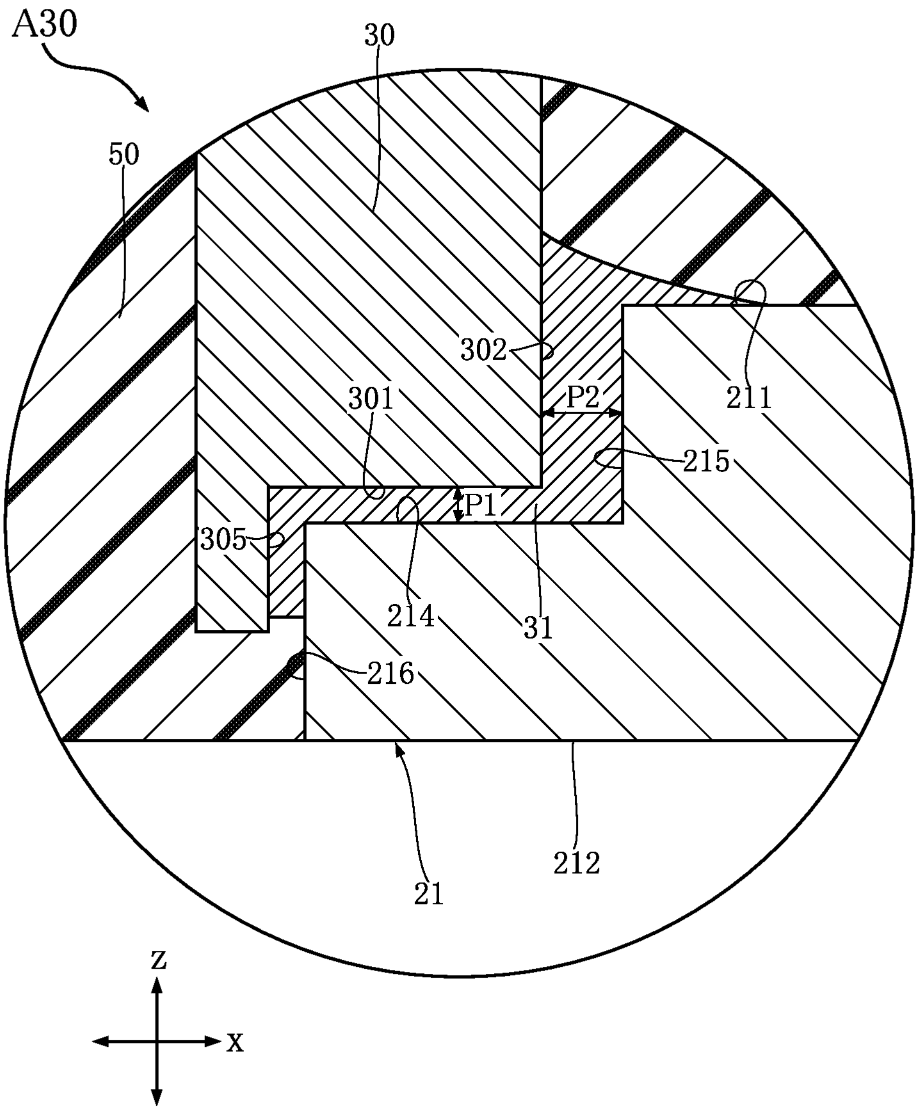
FIG. 18 is a partial enlarged view of FIG. 17.

As shown in FIGS. 16 and 18, the conductive member 30 includes a restricting surface 305. The restricting surface 305 faces toward the same side as the second surface 302 in the first direction x. The restricting surface 305 is located on the side of the first surface 301 opposite to the second surface 302 in the thickness direction z. The restricting surface 305 is located on the side of the first surface 301 opposite to the second surface 302 in the first direction x. The restricting surface 305 is located closer to the semiconductor element 10 than the second surface 302 is in the first direction x. The conductive member 30 is provided with a notch defined by the first surface 301 and the restricting surface 305.

As shown in FIGS. 16 and 18, the restricting surface 305 of the conductive member 30 faces the fifth surface 216 of the first lead 21. A portion of the first conductive joining layer 31 is located between the fifth surface 216 and the restricting surface 305. The first conductive joining layer 31 is in contact with the fifth surface 216 and the restricting surface 305.

Next, a semiconductor device A31 that is a variation of the semiconductor device A30 will be described based on FIG. 19. Here, the position of FIG. 19 is the same as the position of FIG. 18.

Figure 19:
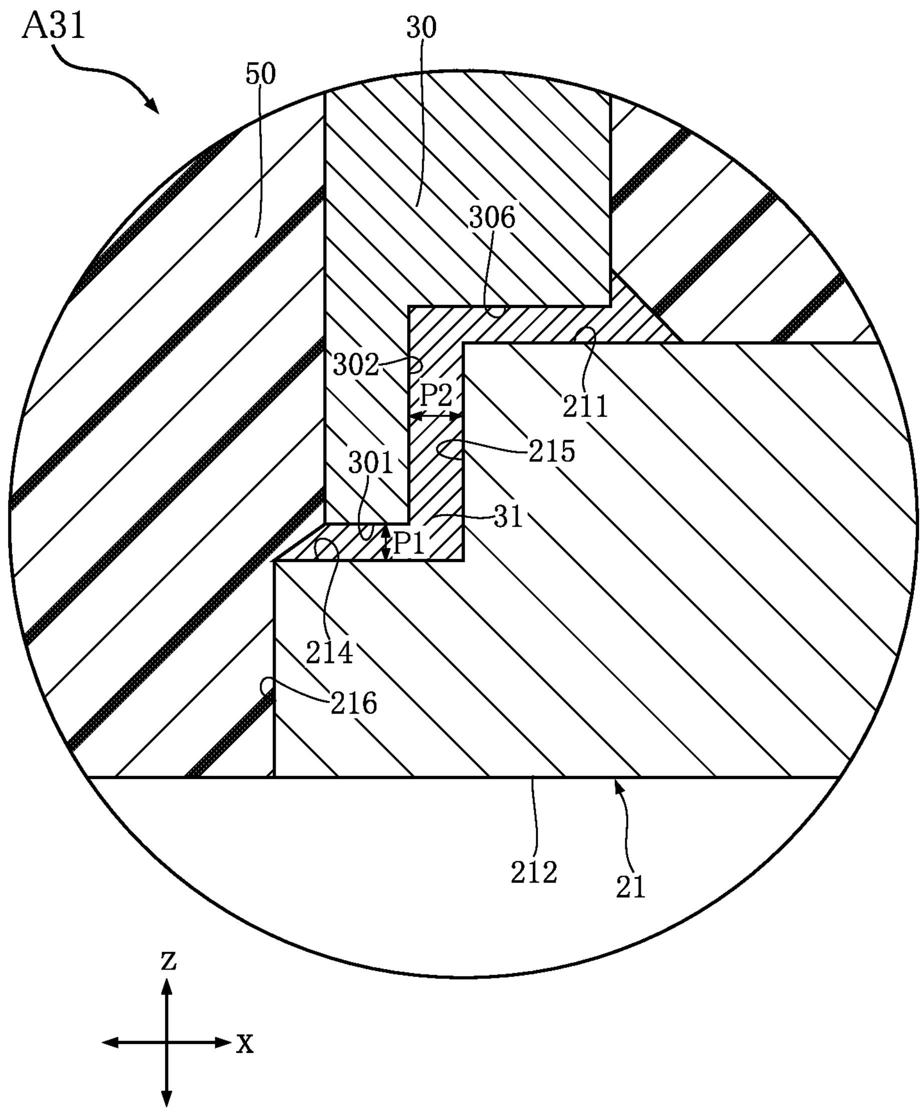
FIG. 19 is a partial enlarged cross-sectional view of a variation of the semiconductor device shown in FIG. 16.

As shown in FIG. 19, in the semiconductor device A31, the conductive member 30 includes an opposing surface 306 in place of the restricting surface 305. The opposing surface 306 faces toward the same side as the first surface 301 in the thickness direction z. The opposing surface 306 is located on the side of the second surface 302 opposite to the first surface 301 in the thickness direction z. The opposing surface 306 is located on the side of the second surface 302 opposite to the first surface 301 in the first direction x. The opposing surface 306 is located farther from the semiconductor element 10 than the first surface 301 is in the first direction x. The conductive member 30 is provided with a notch defined by the second surface 302 and the opposing surface 306.

As shown in FIG. 19, the opposing surface 306 of the conductive member 30 faces the first obverse surface 211 of the first lead 21. A portion of the first conductive joining surface 31 is located between the first obverse surface 211 and the opposing surface 306. The first conductive joining layer 31 is in contact with the opposing surface 306.

Next, operation and effects of the semiconductor device A30 will be described.

The semiconductor device A30 includes the first lead 21, the conductive member 30 that electrically connects the first lead 21 and the first electrode 11 of the semiconductor element 10, and the first conductive joining layer 31 that conductively joins the first lead 21 and the conductive member to each other. The conductive member 30 includes the first surface 301 that faces the first lead 21 in the thickness direction z and the second surface 302 that faces the first lead 21 in the first direction x. The first lead 21 includes the third surface 214 that faces the first surface 301 and the fourth surface 215 that faces the second surface 302. The first conductive joining layer 31 is connected to the first surface 301 and the third surface 214. Accordingly, with the semiconductor device A30 as well, deviation of the conductive member 30 relative to an electrode (first electrode 11) of the semiconductor element 10 can be suppressed. Furthermore, as a result of the semiconductor device A30 having a similar configuration to the semiconductor device A10, the semiconductor device A30 also exhibits operation and effects realized by the configuration of the semiconductor device A10.

In the semiconductor device A30, the conductive member includes the restricting surface 305 that faces the fifth surface 216 of the first lead 21. By employing this configuration, when the conductive member 30 is conductively joined to the first lead 21 via the first conductive joining layer 31, if the conductive member 30 attempts to shift in the first direction x, the restricting surface 305 comes into contact with the fifth surface 216, or alternatively, the first conductive joining layer 31 is sandwiched between the restricting surface 305 and the fifth surface 216. Accordingly, displacement of the conductive member 30 in the first direction x is restricted by both the second surface 302 and the restricting surface 305, and thus deviation of the conductive member 30 relative to the first electrode 11 of the semiconductor element 10 in the first direction x can be effectively suppressed. In this case, if a portion of the first conductive joining layer 31 is located between the fifth surface 216 and the restricting surface 305 and is in contact with the fifth surface 216 and the restricting surface 305, the joining area between the conductive member 30 and the first lead 21 is increased. Accordingly, the joining strength between the conductive member 30 and the first lead 21 can be improved.

In the semiconductor device A31, the conductive member includes the opposing surface 306 that faces the first obverse surface 211 of the first lead 21. The first conductive joining layer 31 is in contact with the first obverse surface 211 and the opposing surface 306. By employing this configuration, when the conductive member 30 is conductively joined to the first lead 21 via the first conductive joining layer 31, an increased amount of reactionary force in the thickness direction z acts on the conductive member 30 from the first lead 21 via the first conductive joining layer 31. Accordingly, the joining area between the conductive member 30 and the first lead 21 is increased, and an increased amount of compression stress acts on the first conductive joining layer 31 in the thickness direction z, and thus the joining strength between the conductive member 30 and the first lead 21 can be improved.

A semiconductor device A40 according to a fourth embodiment of the present disclosure will be described based on FIGS. 20 to 22. In these drawings, elements identical to or similar to those of the aforementioned semiconductor device A10 are given the same reference symbols, and redundant description thereof is omitted. Here, for the sake of comprehension, the sealing resin 50 is shown in a transparent manner in FIG. 20

The configurations of the first lead 21 and the conductive member 30 of the semiconductor device A40 differ from those of the configurations of the above semiconductor device A10.

Figure 20:
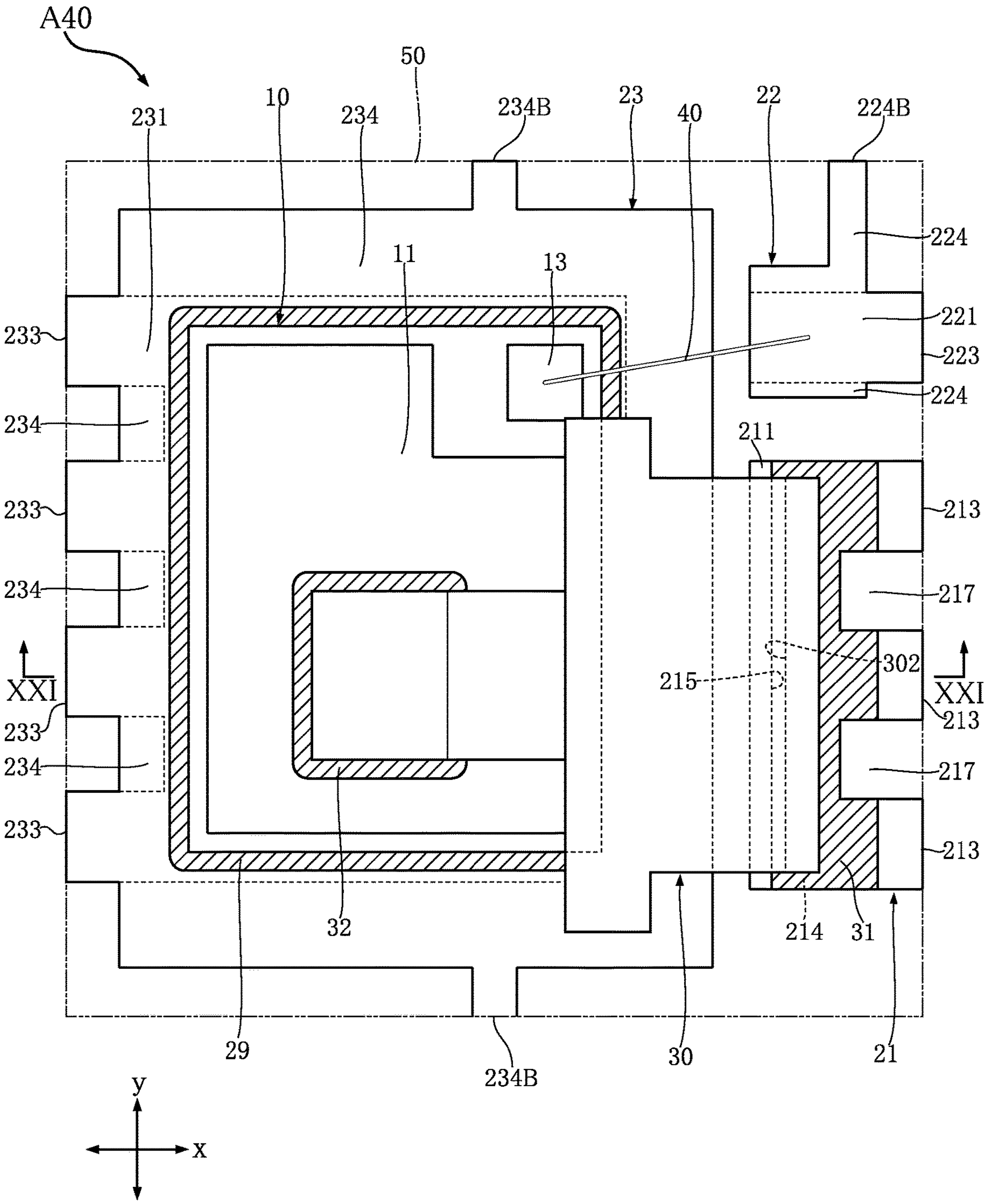
FIG. 20 is a plan view of a semiconductor device according to a fourth embodiment of the present disclosure in which a sealing resin is shown in a transparent manner.
Figure 21:
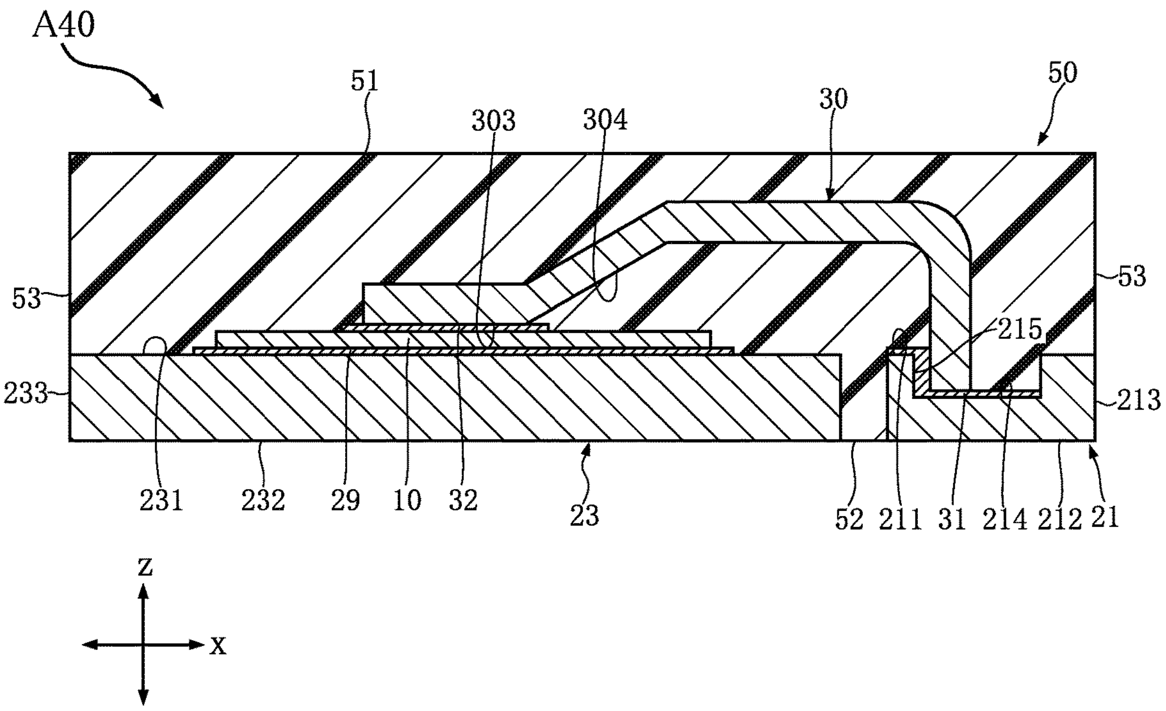
FIG. 21 is a cross-sectional view taken along line XXI-XXI in FIG. 20.
Figure 22:
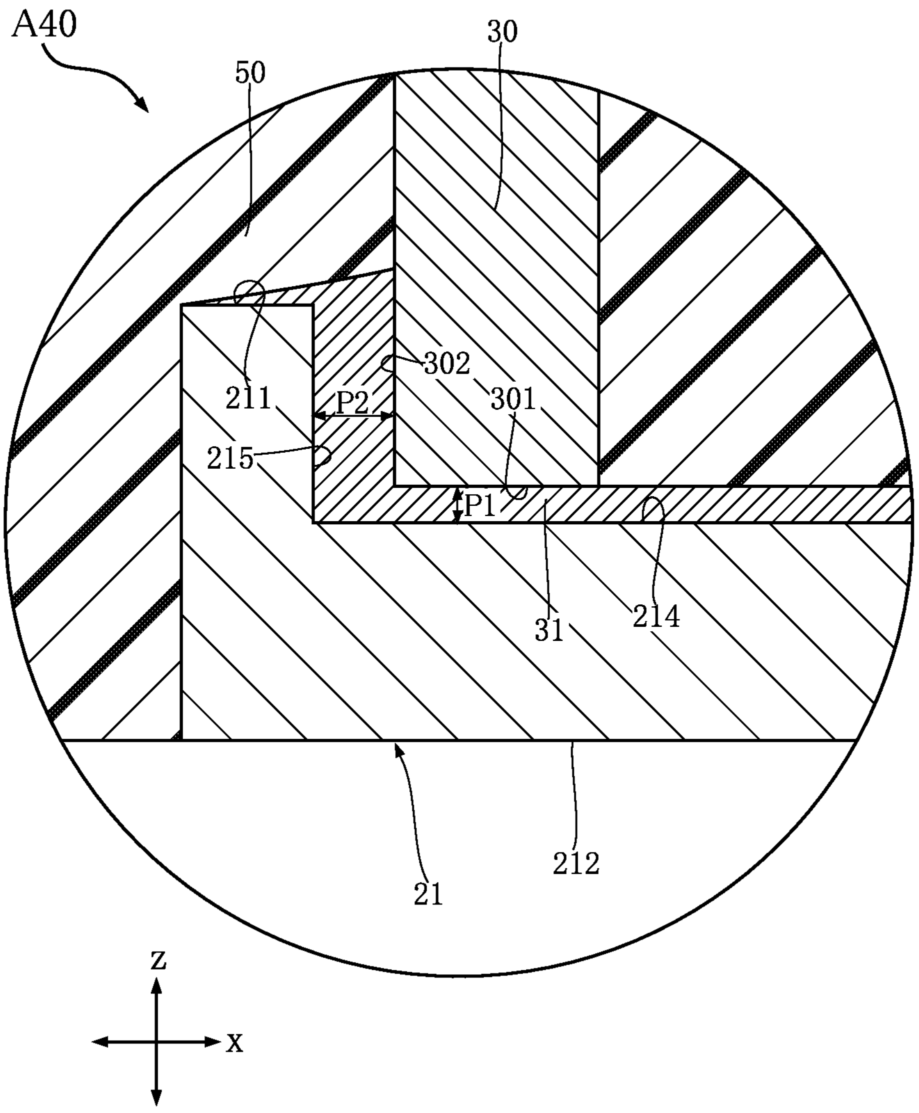
FIG. 22 is a partial enlarged view of FIG. 21.

As shown in FIGS. 20 to 22, in the semiconductor device A40, the first lead 21 does not have the fifth surface 216. The fourth surface 215 of the first lead 21 faces toward the side opposite to the side on which the semiconductor element is located in the first direction x. The third surface 214 of the first lead 21 is located between the fourth surface 215 and the first side surfaces 213 in the first direction x. The first obverse surface 211 of the first lead 21 is located closer to the semiconductor element 10 than the third surface 214 is in the first direction x.

As shown in FIGS. 20 and 21, the conductive member 30 extends across the first obverse surface 211 of the first lead 21.

Next, operation and effects of the semiconductor device A40 will be described.

The semiconductor device A40 includes the first lead 21, the conductive member 30 that electrically connects the first lead 21 and the first electrode 11 of the semiconductor element 10 to each other, and the first conductive joining layer 31 that conductively joins the first lead 21 and the conductive member 30 to each other. The conductive member 30 includes the first surface 301 that faces the first lead 21 in the thickness direction z and the second surface 302 that faces the first lead 21 in the first direction x. The first lead 21 includes the third surface 214 that faces the first surface 301 and the fourth surface 215 that faces the second surface 302. The first conductive joining layer 31 is in contact with the first surface 301 and the third surface 214. Accordingly, with the semiconductor device A40 as well, deviation of the conductive member 30 relative to an electrode (first electrode 11) of the semiconductor element 10 can be suppressed. Furthermore, as a result of the semiconductor device A40 having a similar configuration to the semiconductor device A10, the semiconductor device A40 also exhibits operation and effects realized by the configuration of the semiconductor device A10.

The present disclosure is not limited to the aforementioned embodiments. The specific configurations of portions of the present disclosure can be designed in various ways.

The present disclosure includes the embodiments described in the following Clauses.

Clause 1

A semiconductor device including:
- a first lead;
- a semiconductor element provided with a first electrode;
- a conductive member electrically connecting the first lead and the first electrode to each other;
- a first conductive joining layer conductively joining the first lead and the conductive member to each other; and
- a second conductive joining layer conductively joining the first electrode and the conductive member to each other,
- wherein the conductive member includes a first surface facing the first lead in a thickness direction of the semiconductor element, and a second surface facing the first lead in a first direction orthogonal to the thickness direction,
- the first lead includes a third surface facing the first surface, and a fourth surface facing the second surface, and
- the first conductive joining layer is in contact with the first surface and the third surface.

Clause 2.

The semiconductor device according to clause 1, wherein the third surface faces toward the same side as an outer surface of the first electrode in the thickness direction.

Clause 3.

The semiconductor device according to clause 2, wherein the first conductive joining layer is in contact with the second surface and the fourth surface.

Clause 4.

The semiconductor device according to clause 3, wherein the first surface is a curved surface recessed in the thickness direction.

Clause 5.

The semiconductor device according to clause 3 or 4,
- wherein a largest value of a first interval from the first surface to the third surface is smaller than a largest value of a second interval from the second surface to the fourth surface.

Clause 6.

The semiconductor device according to any one of clauses 3 to 5,
- wherein the first lead includes a first obverse surface facing toward the same side as the third surface in the thickness direction, and
- the first obverse surface is located on a side of the fourth surface opposite to the third surface in the thickness direction.

Clause 7.

The semiconductor device according to clause 6, wherein the fourth surface faces toward a side on which the semiconductor element is located in the first direction.

Clause 8.

The semiconductor device according to clause 7, wherein the first conductive joining layer is in contact with the first obverse surface.

Clause 9.

The semiconductor device according to clause 6,
- wherein the fourth surface faces toward a side opposite to a side on which the semiconductor element is located in the first direction, and the conductive member extends across the first surface.

Clause 10.

The semiconductor device according to clause 7 or 8,
- wherein the first lead includes a first mounting surface facing toward a side opposite to the third surface in the thickness direction, and a fifth surface facing toward the same side as the fourth surface in the first direction,
- the third surface overlaps with the first mounting surface as viewed in the thickness direction, and
- the fifth surface is located between the first mounting surface and the third surface in the thickness direction and is located on a side of the third surface opposite to the fourth surface in the first direction.

Clause 11.

The semiconductor device according to clause 10, wherein the conductive member includes a restricting surface facing the fifth surface.

Clause 12.

The semiconductor device according to clause 11, wherein a portion of the first conductive joining layer is located between the fifth surface and the restricting surface.

Clause 13.

The semiconductor device according to any one of clauses to 12, wherein the first conductive joining layer and the second conductive joining layer contain tin.

Clause 14.

The semiconductor device according to clause 13, further including:
- a die pad spaced apart from the first lead; and
- a joining layer joining the die pad and the semiconductor element to each other,
- wherein the joining layer contains tin.

Clause 15.

The semiconductor device according to clause 14,
- wherein the semiconductor element is provided with a second electrode located on a side opposite to the first electrode in the thickness direction, and
- the joining layer is in contact with the second electrode.

Clause 16.

The semiconductor device according to clause 15, further including
- a second lead spaced apart from the first lead in a second direction orthogonal to the thickness direction and the first direction, wherein the semiconductor element is provided with a gate electrode located on the same side as the first electrode in the thickness direction, and the second lead is electrically connected to the gate electrode.

Clause 17.

The semiconductor device according to any one of clauses 14 to 16, further comprising:

a sealing resin covering the semiconductor element, the conductive member, and portions of the first lead and the die pad, wherein the die pad includes a reverse surface facing toward a side opposite to the side on which the semiconductor element is located in the thickness direction, and the first mounting surface and the reverse surface are exposed from the sealing resin.

Clause 18.

The semiconductor device according to clause 17, wherein the first lead includes a first side surface facing toward a side opposite to the side on which the semiconductor element is located in the first direction, and the first side surface is exposed from the sealing resin.

REFERENCE NUMERALS

| | | |
|---|---|---|
| A10, A20, A30, A40: Semiconductor device | | |
| 10: Semiconductor element | 11: First electrode | |
| 12: Second electrode | | |
| 13: Gate electrode | 21: First lead | |
| 211: First obverse surface | | |
| 212: First mounting surface | 213: First side surface | |
| 214: Third surface | | |
| 215: Fourth surface | 216: Fifth surface | 217: Recess |
| 22: Second lead | 221: Second obverse surface | |
| 222: Second mounting surface | | |
| 223: Second side surface | 224: Thin portion | |
| 224A: Intermediate surface | | |
| 224B: End surface | 23: Die pad | 231: Installation surface |
| 232: Reverse surface | 233: Peripheral surface | |
| 234: Thin portion | | |
| 234A: Intermediate surface | 234B: End surface | |
| 29: Joining layer | | |
| 30: Conductive member | 301: First surface | |
| 302: Second surface | | |
| 303: Joining surface | 304: Inclined surface | |
| 305: Restricting surface | | |
| 306: Opposing surface | 31: First conductive member | |
| 32: Second conductive member | | |
| 40: Wire | 50: Sealing resin | 51: Top surface |
| 52: Bottom surface | 53: First side surface | |
| 54: Second side surface | | |
| P1: First interval | P2: Second interval | |
| z: Thickness direction | x: First direction | |
| y: Second direction | | |

The invention claimed is:

1. A semiconductor device comprising:

a first lead;

a semiconductor element provided with a first electrode;

a conductive member electrically connecting the first lead and the first electrode to each other;

a first conductive joining layer conductively joining the first lead and the conductive member to each other; and a second conductive joining layer conductively joining the first electrode and the conductive member to each other, wherein the conductive member includes a first surface facing the first lead in a thickness direction of the semiconductor element, and a second surface facing the first lead in a first direction orthogonal to the thickness direction, the first lead includes a third surface facing the first surface, and a fourth surface facing the second surface, the first conductive joining layer is in contact with the first surface and the third surface, the first lead includes a first obverse surface facing toward the same side as the third surface in the thickness direction, the first obverse surface being located on a side of the fourth surface opposite to the third surface in the thickness direction, and the first conductive joining layer is in contact with the first obverse surface.

2. The semiconductor device according to claim 1, wherein the third surface faces toward a same side as an outer surface of the first electrode in the thickness direction.

3. The semiconductor device according to claim 2, wherein the first conductive joining layer is in contact with the second surface and the fourth surface.

4. The semiconductor device according to claim 3, wherein the first surface is a curved surface recessed in the thickness direction.

5. The semiconductor device according to claim 3, wherein a largest value of a first interval from the first surface to the third surface is smaller than a largest value of a second interval from the second surface to the fourth surface.

6. The semiconductor device according to claim 1, wherein the fourth surface faces toward a side opposite to a side on which the semiconductor element is located in the first direction, and the conductive member extends across the first obverse surface.

7. The semiconductor device according to claim 1, wherein the fourth surface faces toward a side on which the semiconductor element is located in the first direction.

8. The semiconductor device according to claim 7, wherein the first lead includes a first mounting surface facing toward a side opposite to the third surface in the thickness direction, and a fifth surface facing toward the same side as the fourth surface in the first direction, the third surface overlaps with the first mounting surface as viewed in the thickness direction, and the fifth surface is located between the first mounting surface and the third surface in the thickness direction and is located on a side of the third surface opposite to the fourth surface in the first direction.

9. The semiconductor device according to claim 8, wherein the conductive member includes a restricting surface facing the fifth surface.

10. The semiconductor device according to claim 9, wherein a portion of the first conductive joining layer is located between the fifth surface and the restricting surface.

11. The semiconductor device according to claim 8, wherein the first conductive joining layer and the second conductive joining layer contain tin.

12. The semiconductor device according to claim 11, further comprising:

a die pad spaced apart from the first lead; and a joining layer joining the die pad and the semiconductor element to each other, wherein the joining layer contains tin.

13. The semiconductor device according to claim 12, wherein the semiconductor element is provided with a second electrode located on a side opposite to the first electrode in the thickness direction, and the joining layer is in contact with the second electrode.

14. The semiconductor device according to claim 13, further comprising a second lead spaced apart from the first lead in a second direction orthogonal to the thickness direction and the first direction, wherein the semiconductor element is provided with a gate electrode located on a same side as the first electrode in the thickness direction, and the second lead is electrically connected to the gate electrode.

15. The semiconductor device according to claim 12, further comprising:

a sealing resin covering the semiconductor element, the conductive member, and portions of the first lead and the die pad, wherein the die pad includes a reverse surface facing toward a side opposite to the side on which the semiconductor element is located in the thickness direction, and the first mounting surface and the reverse surface are exposed from the sealing resin.

16. The semiconductor device according to claim 15, wherein the first lead includes a first side surface facing toward a side opposite to the side on which the semiconductor element is located in the first direction, and the first side surface is exposed from the sealing resin.

* * * * *